US010684650B2

(12) United States Patent
Sim et al.

(10) Patent No.: US 10,684,650 B2
(45) Date of Patent: Jun. 16, 2020

(54) ELECTRONIC DEVICE INCLUDING MODULE MOUNTED IN SUNKEN AREA OF LAYER

(71) Applicant: Samsung Electronics Co., Ltd., Gyeonggi-do (KR)

(72) Inventors: Young Bae Sim, Gyeongsangbuk-do (KR); Hyun Suk Choi, Daegu (KR); Do Yeong Kim, Gyeongsangbuk-do (KR); Min Chul Kim, Daegu (KR); Sang Yup Lee, Daegu (KR); Sung Yoon Jung, Daegu (KR); Jin Woo Park, Gyeongsangbuk-do (KR); Ji Woo Lee, Gyeongsangbuk-do (KR); Yeun Wook Lim, Daegu (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 15/988,575

(22) Filed: May 24, 2018

(65) Prior Publication Data
US 2018/0341290 A1    Nov. 29, 2018

(30) Foreign Application Priority Data

May 29, 2017    (KR) ........................ 10-2017-0065851

(51) Int. Cl.
*G06F 1/16*    (2006.01)
*H05K 5/00*    (2006.01)
*G06F 3/0354*    (2013.01)
*G06F 3/042*    (2006.01)
(Continued)

(52) U.S. Cl.
CPC .......... *G06F 1/1643* (2013.01); *G06F 1/1626* (2013.01); *G06F 1/1637* (2013.01);
(Continued)

(58) Field of Classification Search
CPC ....... G06F 1/1626; G06F 1/163; G06F 1/1637
See application file for complete search history.

(56) References Cited

U.S. PATENT DOCUMENTS 9,244,549 B2    1/2016    Lee et al.
9,495,035 B2    11/2016    Lee et al.
(Continued)

FOREIGN PATENT DOCUMENTS

KR    1020110075134    7/2011
KR    101145157    5/2012
(Continued)

OTHER PUBLICATIONS

European Search Report dated Oct. 9, 2018 issued in counterpart application No. 18174865.8-1221, 8 pages.

*Primary Examiner* — Chun-Nan Lin
(74) *Attorney, Agent, or Firm* — The Farrell Law Firm, P.C.

(57) ABSTRACT

An electronic device is provided. The electronic device includes a housing including a first plate, a second plate facing away from the first plate, and a side member surrounding a space between the first plate and the second plate, a touch screen display disposed between the first plate and the second plate, a fingerprint sensor, a digitizer including a layer having a conductive pattern, and a processor. The layer includes a first portion positioned between the second plate and a second area of the touch screen display that surrounds the first area when viewed from above the first plate and a second portion continuously extending from the first portion, the second portion positioned such that the fingerprint sensor is disposed between the second portion and the touch screen display, and such that the second portion is closer to the second plate than the first portion.

20 Claims, 18 Drawing Sheets

(51) Int. Cl.
  *G06F 3/041* (2006.01)
  *G06K 9/00* (2006.01)
  *G06K 9/22* (2006.01)
  *H05K 9/00* (2006.01)
(52) U.S. Cl.
  CPC .......... *G06F 1/1658* (2013.01); *G06F 1/1684* (2013.01); *G06F 3/03545* (2013.01); *G06F 3/041* (2013.01); *G06F 3/042* (2013.01); *G06K 9/00013* (2013.01); *G06K 9/22* (2013.01); *H05K 5/0017* (2013.01); *H05K 5/0086* (2013.01); *G06F 1/163* (2013.01); *G06K 9/0004* (2013.01); *H05K 9/0054* (2013.01)

(56) References Cited

U.S. PATENT DOCUMENTS

| | | | |
|---|---|---|---|
| 9,710,689 B2 | 7/2017 | Evans et al. | |
| 2013/0300736 A1* | 11/2013 | Schmidt | G06T 17/20 345/419 |
| 2014/0002390 A1 | 1/2014 | Lee et al. | |
| 2014/0133715 A1 | 5/2014 | Ballard et al. | |
| 2016/0004899 A1* | 1/2016 | Pi | G06F 1/1626 345/173 |
| 2016/0139718 A1 | 5/2016 | Lee et al. | |
| 2016/0313815 A1 | 10/2016 | Lee | |
| 2016/0314334 A1* | 10/2016 | He | G06K 9/0004 |
| 2017/0124372 A1* | 5/2017 | Evans, V | G06F 1/1684 |
| 2017/0270335 A1 | 9/2017 | Evans et al. | |
| 2017/0308731 A1* | 10/2017 | Evans, V | G06F 1/1684 |
| 2017/0316248 A1* | 11/2017 | He | G06K 9/00006 |
| 2017/0372122 A1* | 12/2017 | Shim | G06F 3/0414 |

FOREIGN PATENT DOCUMENTS

| | | |
|---|---|---|
| KR | 101349924 | 1/2014 |
| KR | 1020160126656 | 11/2016 |
| WO | WO 2017/075469 | 5/2017 |

* cited by examiner

ELECTRONIC DEVICE INCLUDING MODULE MOUNTED IN SUNKEN AREA OF LAYER

CROSS-REFERENCE TO RELATED APPLICATION(S)

This application is based on and claims priority under 35 U.S.C. § 119 to Korean Patent Application Serial No. 10-2017-0065851, filed on May 29, 2017 in the Korean Intellectual Property Office, the entire disclosure of which is incorporated herein by reference.

BACKGROUND

1. Field

The disclosure relates, generally, to an electronic device, and more particularly, to an electronic device that includes a module mounted in a sunken area of a layer.

2. Description of the Related Art

Portable electronic devices that include displays, such as a smartphone, a wearable device, or the like, are widely utilized. The portable electronic devices may include a touch screen display having a touch panel. The touch screen display may serve as an input device for receiving a user input, and as a visual display device.

The size of the touch screen display equipped in the portable electronic devices has continued to increase depending on user demands. As the size of the touch screen display increases, a large portion of the front surface of the electronic devices may be occupied by the touch screen display. In such instances, a hardware module intended to be disposed on the front surface of the electronic device may be disposed on a rear surface of the touch screen display. However, the hardware module and/or various layers included in the touch screen display may adversely affect each other directly or indirectly.

SUMMARY

The present disclosure has been made to address at least the disadvantages described above and to provide at least the advantages described below.

Accordingly, an aspect of the present disclosure provides a structure for mounting a hardware module in a sunken area or a recessed portion of a specified layer disposed below a touch screen display with which a front surface of an electronic device is substantially configured and to provide an electronic device including the same.

In accordance with an aspect of the present disclosure, there is provided an electronic device. The electronic device includes a housing including a first plate, a second plate facing away from the first plate, and a side member surrounding a space between the first plate and the second plate. The electronic device includes a touch screen display disposed in the housing between the first plate and the second plate, a fingerprint sensor disposed between a first area of the touch screen display and the second plate, the fingerprint sensor facing toward the first plate, a digitizer including a layer having a conductive pattern, a wireless communication circuit, and a processor operatively connected to the touch screen display, the fingerprint sensor, the digitizer, and the wireless communication circuit. The layer includes a first portion positioned between the second plate and a second area of the touch screen display that surrounds the first area when viewed from above the first plate, and a second portion continuously extending from the first portion. The second portion is positioned such that the fingerprint sensor is disposed between the second portion and the touch screen display, and such that the second portion is closer to the second plate than the first portion.

In accordance with an aspect of the present disclosure, there is provided an electronic device. The electronic device includes a housing including a first plate, a second plate facing away from the first plate, and a side member surrounding a space between the first plate and the second plate. The electronic device includes a touch screen display disposed in the housing between the first plate and the second plate, a fingerprint sensor disposed between a first area of the touch screen display and the second plate, the fingerprint sensor facing toward the first plate, a flexible printed circuit board including a layer having a conductive pattern, a wireless communication circuit, and a processor operatively connected to the touch screen display, the fingerprint sensor, the flexible printed circuit board, and the wireless communication circuit. The layer includes a first portion positioned between a second area of the touch screen display and the second plate, and a second portion continuously extending from the first portion. The second area surrounds the first area when viewed from above the first plate, and the second portion is positioned such that the fingerprint sensor is disposed between the second portion and the touch screen display, and such that the second portion is closer to the second plate than the first portion.

In accordance with an aspect of the present disclosure, there is provided an electronic device. The electronic device includes a display panel including a plurality of pixels on a first surface, a hardware module, and a layer disposed to face a second surface of the display panel that is opposite to the first surface, and the hardware module is disposed in a sunken area formed on the layer.

BRIEF DESCRIPTION OF THE DRAWINGS

The above and other aspects, features, and advantages of certain embodiments of the disclosure will be more apparent from the following detailed description taken in conjunction with the accompanying drawings, in which.

DETAILED DESCRIPTION

Figure 1:
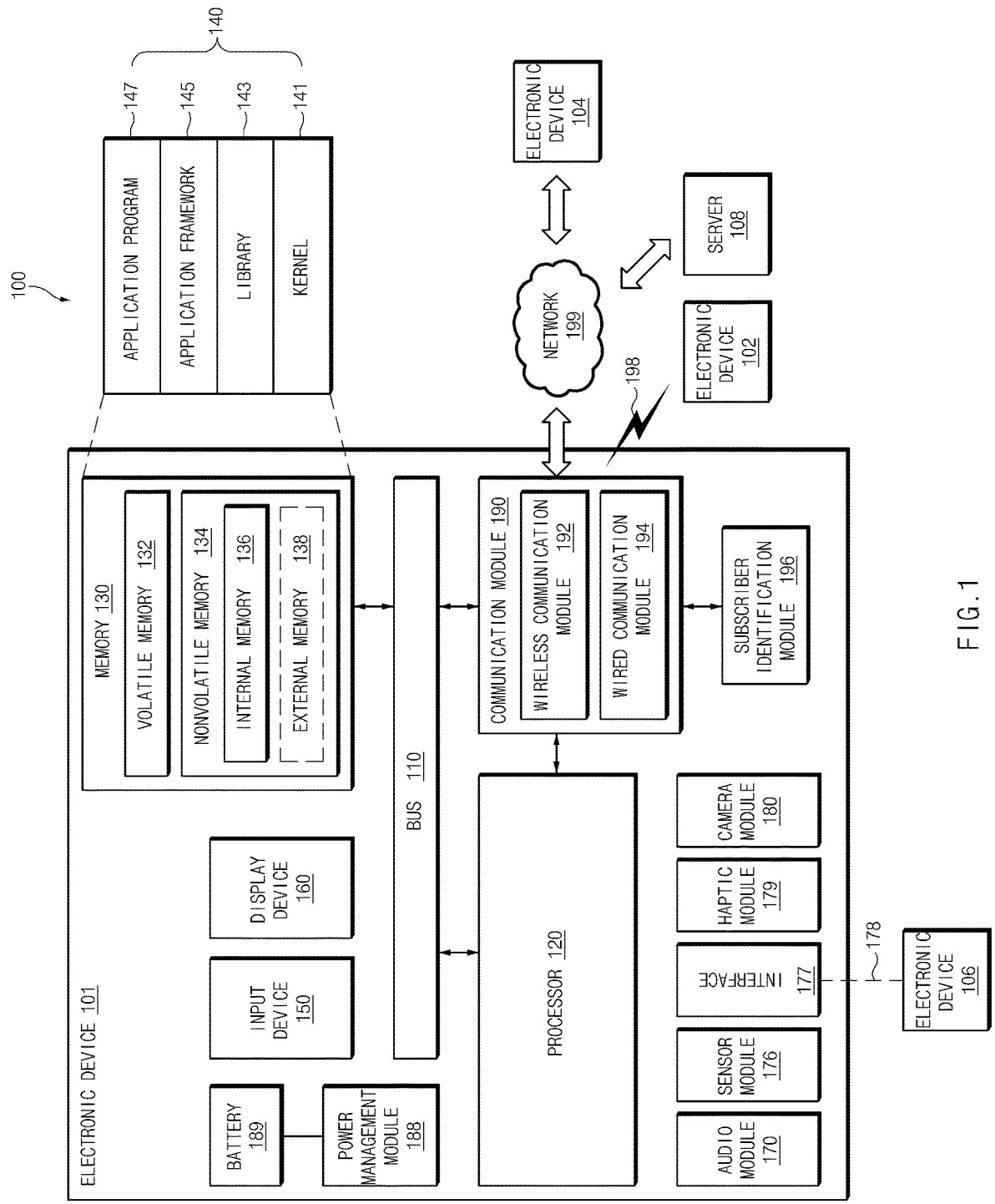
FIG. 1 is a diagram of an electronic device in a network environment according to an embodiment.

Embodiments of the disclosure will be described herein below with reference to the accompanying drawings. However, the embodiments of the disclosure are not limited to the specific embodiments and should be construed as including all modifications, changes, equivalent devices and methods, and/or alternative embodiments of the present disclosure. In the description of the drawings, similar reference numerals are used for similar elements.

The terms "have," "may have," "include," and "may include" as used herein indicate the presence of corresponding features (for example, elements such as numerical values, functions, operations, or parts), and do not preclude the presence of additional features.

The terms "A or B," "at least one of A or/and B," or "one or more of A or/and B" as used herein include all possible combinations of items enumerated with them. For example, "A or B," "at least one of A and B," or "at least one of A or B" means (1) including at least one A, (2) including at least one B, or (3) including both at least one A and at least one B.

The terms such as "first" and "second" as used herein may use corresponding components regardless of importance or an order and are used to distinguish a component from another without limiting the components. These terms may be used for the purpose of distinguishing one element from another element. For example, a first user device and a second user device may indicate different user devices regardless of the order or importance. For example, a first element may be referred to as a second element without departing from the scope the disclosure, and similarly, a second element may be referred to as a first element.

It will be understood that, when an element (for example, a first element) is "(operatively or communicatively) coupled with/to" or "connected to" another element (for example, a second element), the element may be directly coupled with/to another element, and there may be an intervening element (for example, a third element) between the element and another element. To the contrary, it will be understood that, when an element (for example, a first element) is "directly coupled with/to" or "directly connected to" another element (for example, a second element), there is no intervening element (for example, a third element) between the element and another element.

The expression "configured to (or set to)" as used herein may be used interchangeably with "suitable for," "having the capacity to," "designed to," "adapted to," "made to," or "capable of" according to a context. The term "configured to (set to)" does not necessarily mean "specifically designed to" in a hardware level. Instead, the expression "apparatus configured to . . . " may mean that the apparatus is "capable of . . . " along with other devices or parts in a certain context. For example, "a processor configured to (set to) perform A, B, and C" may mean a dedicated processor (e.g., an embedded processor) for performing a corresponding operation, or a generic-purpose processor (e.g., a central processing unit (CPU) or an application processor (AP)) capable of performing a corresponding operation by executing one or more software programs stored in a memory device.

The terms used in describing the various embodiments of the disclosure are for the purpose of describing particular embodiments and are not intended to limit the disclosure. As used herein, the singular forms are intended to include the plural forms as well, unless the context clearly indicates otherwise. All of the terms used herein including technical or scientific terms have the same meanings as those generally understood by an ordinary skilled person in the related art unless they are defined otherwise. The terms defined in a generally used dictionary should be interpreted as having the same or similar meanings as the contextual meanings of the relevant technology and should not be interpreted as having ideal or exaggerated meanings unless they are clearly defined herein. According to circumstances, even the terms defined in this disclosure should not be interpreted as excluding the embodiments of the disclosure.

The term "module" as used herein may, for example, mean a unit including one of hardware, software, and firmware or a combination of two or more of them. The term "module" may be interchangeably used with, for example, the term "unit", "logic", "logical block", "component", or "circuit". The "module" may be a minimum unit of an integrated component element or a part thereof. The "module" may be a minimum unit for performing one or more functions or a part thereof. The "module" may be mechanically or electronically implemented. For example, the "module" according to the disclosure may include at least one of an application-specific integrated circuit (ASIC) chip, a field-programmable gate array (FPGA), and a programmable-logic device for performing operations which has been known or are to be developed hereinafter.

Each element (e.g., a module or a program module) according to the disclosure may be composed of single entity or a plurality of entities, a part of the above-described sub-elements may be omitted or may further include other sub-elements. Alternatively or additionally, after being integrated in one entity, some elements (e.g., a module or a program module) may identically or similarly perform the function executed by each corresponding element before integration. Operations executed by modules, program modules, or other elements may be executed by a successive method, a parallel method, a repeated method, or a heuristic method, or at least one part of operations may be executed in different sequences or omitted. Alternatively, other operations may be added.

According to the disclosure, at least a part of an apparatus (e.g., modules or functions thereof) or a method (e.g., operations) may be, for example, implemented by instructions stored in a computer-readable storage media (e.g., memory) in the form of a program module. The instruction, when executed by a processor, may cause the processor to perform a function corresponding to the instruction. The computer-readable recording medium may include a hard disk, a floppy disk, a magnetic media (e.g., a magnetic tape), an optical media (e.g., a compact disc read only memory (CD-ROM) and a digital versatile disc (DVD), a magneto-optical media (e.g., a floptical disk)), an embedded memory, and the like. The one or more instructions may contain a code made by a compiler or a code executable by an interpreter.

An electronic device according to the disclosure may include at least one of, for example, a smart phone, a tablet personal computer (PC), a mobile phone, a video phone, an electronic book reader (e-book reader), a desktop PC, a laptop PC, a netbook computer, a workstation, a server, a personal digital assistant (PDA), a portable multimedia player (PMP), a MPEG-1 audio layer-3 (MP3) player, a mobile medical device, a camera, and a wearable device. The wearable device may include at least one of an accessory type (e.g., a watch, a ring, a bracelet, an anklet, a necklace, a glasses, a contact lens, or a head-mounted device (HMD)), a fabric or clothing integrated type (e.g., an electronic clothing), a body-mounted type (e.g., a skin pad, or tattoo), and a bio-implantable type (e.g., an implantable circuit).

The electronic device may be a home appliance. The home appliance may include at least one of, for example, a television, a digital video disk (DVD) player, an audio, a refrigerator, an air conditioner, a vacuum cleaner, an oven, a microwave oven, a washing machine, an air cleaner, a set-top box, a home automation control panel, a security control panel, a TV box (e.g., Samsung HomeSync™, Apple TV™, or Google TV™), a game console (e.g., Xbox™ and PlayStation™), an electronic dictionary, an electronic key, a camcorder, and an electronic photo frame.

The electronic device may include at least one of various medical devices (e.g., various portable medical measuring devices (a blood glucose monitoring device, a heart rate monitoring device, a blood pressure measuring device, a body temperature measuring device, etc.), a magnetic resonance angiography (MRA), a magnetic resonance imaging (MRI), a computed tomography (CT) machine, and an ultrasonic machine), a navigation device, a global positioning system (GPS) receiver, an event data recorder (EDR), a flight data recorder (FDR), a vehicle infotainment device, an electronic device for a ship (e.g., a navigation device for a ship, and a gyro-compass), avionics, security devices, an automotive head unit, a robot for home or industry, an automatic teller machine (ATM) in banks, point of sales (POS) devices in a shop, or an Internet of things (IoT) device (e.g., a light bulb, various sensors, electric or gas meter, a sprinkler device, a fire alarm, a thermostat, a streetlamp, a toaster, a sporting goods, a hot water tank, a heater, a boiler, etc.).

The electronic device may include at least one of a part of furniture or a building/structure, an electronic board, an electronic signature receiving device, a projector, and various kinds of measuring instruments (e.g., a water meter, an electric meter, a gas meter, and a radio wave meter). The electronic device may be a combination of one or more of the aforementioned various devices. The electronic device may also be a flexible device. Further, the electronic device is not limited to the aforementioned devices, and may include an electronic device according to the development of new technology.

Hereinafter, an electronic device will be described with reference to the accompanying drawings. In the disclosure, the term "user" may indicate a person using an electronic device or a device (e.g., an artificial intelligence electronic device) using an electronic device.

FIG. 1 is a diagram of an electronic device 101 in a network environment 100, according to an embodiment.

Referring to FIG. 1, under the network environment 100, the electronic device 101 may communicate with an electronic device 102 through local wireless communication 198 or may communicate with an electronic device 104 or a server 108 through a network 199. The electronic device 101 may communicate with the electronic device 104 through the server 108.

The electronic device 101 may include a bus 110, a processor 120, a memory 130, an input device 150, a display device 160, an audio module 170, a sensor module 176, an interface 177, a haptic module 179, a camera module 180, a power management module 188, a battery 189, a communication module 190, and a subscriber identification module 196. The electronic device 101 may not include at least one (e.g., the display device 160 or the camera module 180) of the above-described elements or may further include other element(s).

The bus 110 may interconnect the above-described elements and may include a circuit for conveying signals (e.g., a control message or data) between the above-described elements.

The processor 120 may include one or more of a central processing unit (CPU), an application processor (AP), a graphic processing unit (GPU), an image signal processor (ISP) of a camera or a communication processor (CP). The processor 120 may be implemented with a system on chip (SoC) or a system in package (SiP). The processor 120 may drive an operating system (OS) or an application to control at least one of another element (e.g., hardware or software element) connected to the processor 120 and may process and compute various data. The processor 120 may load a command or data, which is received from at least one of other elements (e.g., the communication module 190), into a volatile memory 132 to process the command or data and may store the resulting data into a nonvolatile memory 134.

The memory 130 may include a volatile memory 132 and/or a nonvolatile memory 134. The volatile memory 132 may include a random access memory (RAM) (e.g., a dynamic RAM (DRAM), a static RAM (SRAM), or a synchronous DRAM (SDRAM)). The nonvolatile memory 134 may include a programmable read-only memory (PROM), an one time PROM (OTPROM), an erasable PROM (EPROM), an electrically EPROM (EEPROM), a mask ROM, a flash ROM, a flash memory, a hard disk drive (HDD), or a solid-state drive (SSD). In addition, the nonvolatile memory 134 may be configured in the form of an internal memory 136 or the form of an external memory 138 which is available through connection if necessary, based on the connection with the electronic device 101. The external memory 138 may further include a flash drive such as compact flash (CF), secure digital (SD), micro secure digital (Micro-SD), mini secure digital (Mini-SD), extreme digital (xD), a multimedia card (MMC), or a memory stick. The external memory 138 may be operatively or physically connected with the electronic device 101 in a wired manner (e.g., a cable or a universal serial bus (USB)) or a wireless (e.g., Bluetooth) manner.

For example, the memory 130 may store at least one different software element of the electronic device 101, such as a command or data associated with the program 140. The program 140 may include a kernel 141, a library 143, an application framework 145 or an application/application program 147.

The input device 150 may include a microphone, a mouse, or a keyboard (which may include a keyboard physically connected or a virtual keyboard displayed through the display 160).

The display 160 may include a display, a hologram device or a projector, and a control circuit to control a relevant device. The screen may include a liquid crystal display (LCD), a light emitting diode (LED) display, an organic LED (OLED) display, a microelectromechanical systems (MEMS) display, or an electronic paper display. The display 160 may be implemented as flexible, transparent, and/or wearable. The display 160 may include touch circuitry to detect a user's input such as a gesture input, a proximity input, or a hovering input, or a pressure sensor/force sensor to measure the intensity of the pressure by the touch. The touch circuit or the pressure sensor may be implemented integrally with the display 160 or with at least one sensor separately from the display 160. A hologram device may show a stereoscopic image in a space using interference of light. A projector may project light onto a screen to display an image. The screen may be located inside or outside the electronic device 101.

The audio module 170 may convert from a sound into an electrical signal or from an electrical signal into the sound. The audio module 170 may acquire sound through the input device 150 or may output sound through an output device (e.g., a speaker or a receiver) included in electronic device 101, an external electronic device (e.g., electronic device 102 such as a wireless speaker or a wireless headphone) or electronic device 106 (e.g., a wired speaker or a wired headphone) connected with the electronic device 101.

The sensor module 176 may measure or detect an internal operating state (e.g., power or temperature) of the electronic device 101 or an external environment state (e.g., an altitude, a humidity, or brightness) to generate an electrical signal or a data value corresponding to the information of the measured state or the detected state. The sensor module 176 may include at least one of a gesture sensor, a gyro sensor, a barometric pressure sensor, a magnetic sensor, an acceleration sensor, a grip sensor, a proximity sensor, a color sensor (e.g., a red, green, blue (RGB) sensor), an infrared sensor, a biometric sensor (e.g., an iris sensor, a fingerprint sensor, a heartbeat rate monitoring (HRM) sensor, an e-nose sensor, an electromyography (EMG) sensor, an electroencephalogram (EEG) sensor, an electrocardiogram (ECG) sensor), a temperature sensor, a humidity sensor, an illuminance sensor, or a UV sensor. The sensor module 176 may further include a control circuit for controlling at least one or more sensors included therein. The sensor module 176 may be controlled via the processor 120 or a processor (e.g., a sensor hub) separate from the processor 120. When a separate sensor hub is used while the processor 120 is in a sleep state, the separate sensor hub may operate without awakening the processor 120 to control at least a portion of the operation or the state of the sensor module 176.

The interface 177 may include a high definition multimedia interface (HDMI), a universal serial bus (USB), an optical interface, a recommended standard 232 (RS-232), a D-subminiature (D-sub), a mobile high-definition link (MHL) interface, a SD card/MMC (multi-media card) interface, or an audio interface. A connector 178 may physically connect the electronic device 101 and the electronic device 106. The connector 178 may include a USB connector, an SD card/MMC connector, or an audio connector (e.g., a headphone connector).

The haptic module 179 may convert an electrical signal into mechanical stimulation (e.g., vibration or motion) or into electrical stimulation. The haptic module 179 may apply tactile or kinesthetic stimulation to a user. The haptic module 179 may include a motor, a piezoelectric element, or an electric stimulator.

The camera module 180 may capture a still image and a moving picture. The camera module 180 may include at least one lens (e.g., a wide-angle lens and a telephoto lens, or a front lens and a rear lens), an image sensor, an image signal processor, or a flash (e.g., a light emitting diode or a xenon lamp).

The power management module 188, which manages the power of the electronic device 101, may constitute at least a portion of a power management integrated circuit (PMIC).

The battery 189 may include a primary cell, a secondary cell, or a fuel cell and may be recharged by an external power source to supply power to at least one element of the electronic device 101.

The communication module 190 may establish a communication channel between the electronic device 101 and an external device (e.g., electronic device 102, electronic device 104, or the server 108). The communication module 190 may support wired communication or wireless communication through the established communication channel. The communication module 190 may include a wireless communication module 192 or a wired communication module 194. The communication module 190 may communicate with the external device through a first network 198 (e.g., a wireless local area network such as Bluetooth or Infrared Data Association (IrDA)) or a second network 199 (e.g., a wireless wide area network such as a cellular network) through a relevant module among the wireless communication module 192 or the wired communication module 194.

The wireless communication module 192 may support cellular communication, local wireless communication, and global navigation satellite system (GNSS) communication. The cellular communication may include long-term evolution (LTE), LTE Advance (LTE-A), code division multiple access (CMA), wideband CDMA (WCDMA), universal mobile telecommunications system (UMTS), wireless broadband (WiBro), or global system for mobile communications (GSM). The local wireless communication may include wireless fidelity (Wi-Fi), WiFi Direct, light fidelity (Li-Fi), Bluetooth, Bluetooth low energy (BLE), Zigbee, near field communication (NFC), magnetic secure transmission (MST), radio frequency (RF), or a body area network (BAN). The GNSS may include at least one of a global positioning system (GPS), a global navigation satellite system (Glonass), Beidou Navigation Satellite System (Beidou), the European global satellite-based navigation system (Galileo), or the like. "GPS" and "GNSS" may be interchangeably used herein.

When the wireless communication module 192 supports cellar communication, the wireless communication module 192 may identify or authenticate the electronic device 101 within a communication network using the subscriber identification module (e.g., a SIM card) 196. The wireless communication module 192 may include a communication processor (CP) separate from the processor 120 (e.g., an application processor (AP)). In this case, the communication processor may perform at least a portion of the functions associated with at least one of the elements of the electronic device 101 described above in place of the processor 120 when the processor 120 is in an inactive (sleep) state, and in conjunction with the processor 120 when the processor 120 is in an active state. The wireless communication module 192 may include a plurality of communication modules, each supporting a relevant communication scheme among cellular communication, local wireless communication, or a GNSS communication.

The wired communication module 194 may include a local area network (LAN) service, a power line communication, or a plain old telephone service (POTS).

The first network 198 may employ Wi-Fi direct or Bluetooth for transmitting or receiving commands or data through wireless direct connection between the electronic device 101 and electronic device 102. The second network 199 may include a telecommunication network (e.g., a computer network such as a LAN or a WAN, the Internet or a telephone network) for transmitting or receiving commands or data between the electronic device 101 and electronic device 104.

The commands or the data may be transmitted or received between the electronic device 101 and the external electronic device 104 through the server 108 connected with the second network 199. Each of the external electronic devices 102 and 104 may be a device similar to or different from the electronic device 101. All or a part of operations performed by the electronic device 101 may be executed by another or a plurality of other electronic devices (e.g., the electronic devices 102 and 104 or the server 108). When the electronic device 101 executes a function or service automatically or in response to a request, the electronic device 101 may not perform the function or the service internally, but may alternatively or additionally transmit requests for at least a part of a function associated with the electronic device 101 to any other device (e.g., the electronic device 102 or 104 or the server 108). The other electronic device may execute the requested function or additional function and may transmit the execution result to the electronic device 101. The electronic device 101 may provide the requested function or service using the received result or may additionally process the received result to provide the requested function or service. Cloud computing, distributed computing, or client-server computing may be used.

Figure 2:
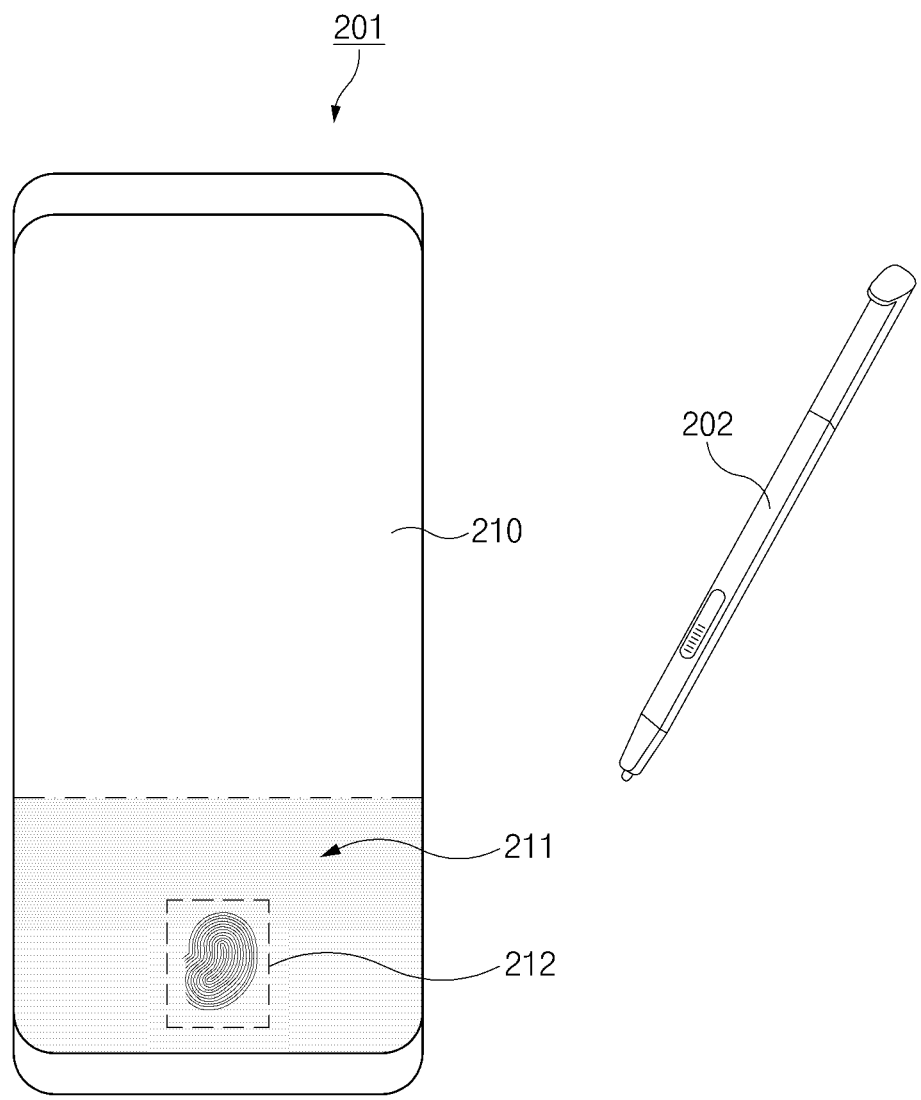
FIG. 2 is a diagram of an electronic device according to an embodiment.

FIG. 2 is a diagram of an electronic device according to an embodiment.

Referring to FIG. 2, an electronic device 201 may include a touch screen display 210 exposed through at least a portion of a first surface (e.g., a front surface) of a housing. The electronic device 201 may include various non-illustrated hardware modules. An electronic pen sensor, such as a digitizer, capable of receiving an input from an electronic pen 202 (e.g., a stylus pen) and a fingerprint sensor capable of detecting a fingerprint of a user may be disposed on a rear surface of the touch screen display 210. The electronic pen sensor may be included in the touch screen display 210.

The electronic device 201 may detect a touch having a specified pressure (also referred to herein as a "force touch") through a specified area 211 of the touch screen display 210. A pressure sensor for detecting a pressure value of the force touch may be disposed on a rear surface of at least a portion of the specified area 211. In addition, when a force touch is applied on an area other than the specified area 211, the electronic device 201 may detect a pressure value of the force touch on the area other than the specified area 211 by computing pressure transmitted to the pressure sensor.

The electronic device 201 may detect a fingerprint of the user through a fingerprint recognition area 212 of the touch screen display 210. The fingerprint recognition area 212 may also be located at the specified area 211 of the touch screen display 210. A fingerprint sensor for detecting the fingerprint may be disposed on a rear surface of the fingerprint recognition area 212 of the touch screen display 210.

A hardware module arrangement structure may be provided that enables the electronic pen sensor to accurately receive an input from the electronic pen 202 when the pressure sensor and/or the fingerprint sensor is disposed on the rear surface of the touch screen display 210. Furthermore, a receiver, a camera module, an iris sensor, or other biometric sensors may be disposed on the rear surface of the touch screen display 210. The electronic pen sensor may be replaced with various panels or layers that include a flexible printed circuit board (FPCB).

Figure 3:
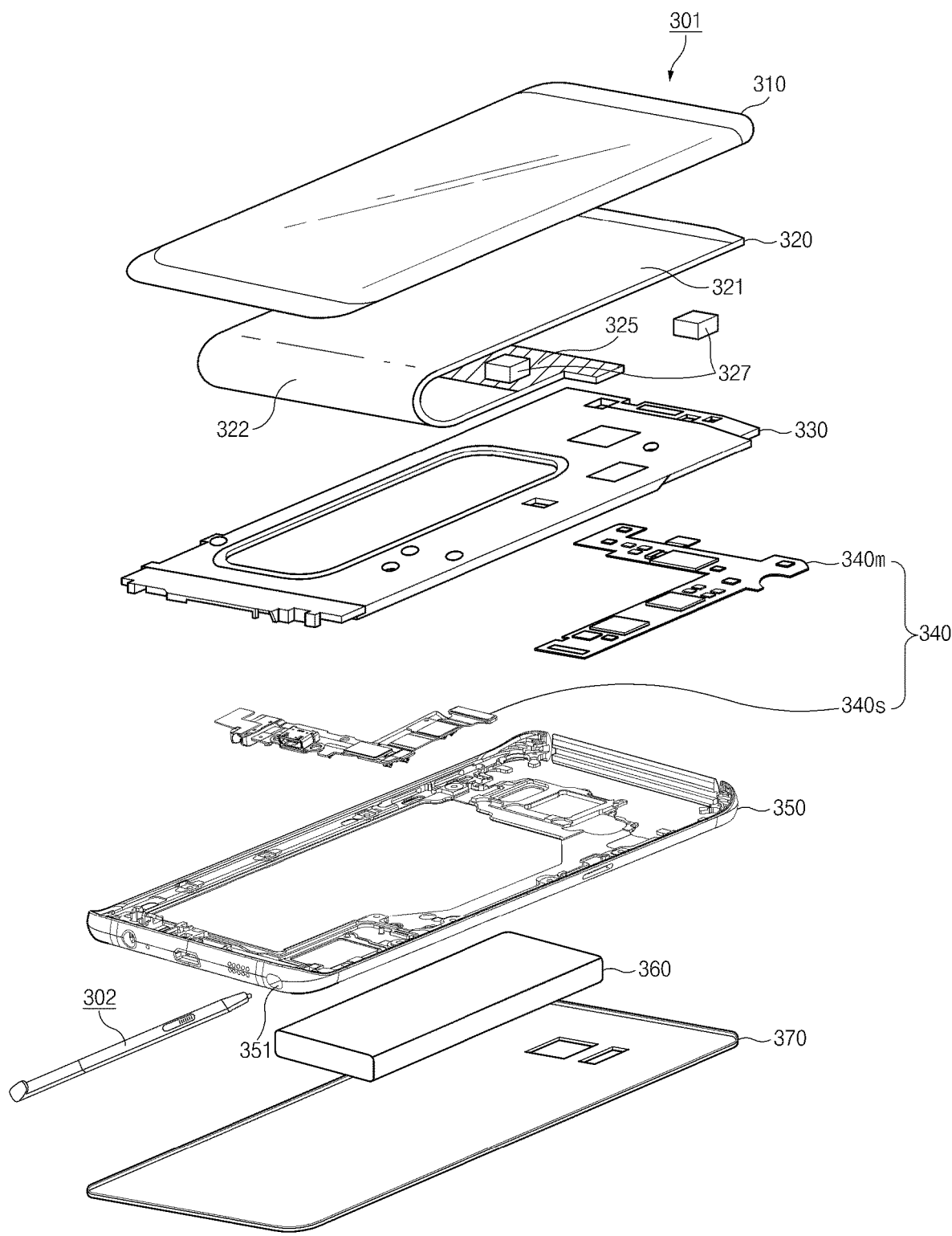
FIG. 3 is a diagram of an electronic device in exploded perspective view according to an embodiment.

FIG. 3 is a diagram of an electronic device in an exploded perspective view according to an embodiment.

Referring to FIG. 3, an electronic device 301 may include a first plate 310 (e.g., a cover glass, etc.), a display device 320, a front hardware module 327, a support member 330, a printed circuit board (PCB) 340, a side member 350, a battery 360, and/or a second plate 370 (e.g., a back cover, etc.). The electronic device 301 may not include some of the elements illustrated in FIG. 3 and may additionally include elements not being illustrated in FIG. 3.

The first plate 310 may pass light generated by the display device 320. A user may touch the first plate 310 (e.g., with a finger, via contact from an electronic pen, etc.) to provide a touch input to the electronic device 301. The first plate 310 may be formed of reinforced glass, reinforced plastic, or a flexible polymer and may protect the display device 320 and elements included in the electronic device 301 from external shocks. The first plate 310 may also be referred to as a cover glass, glass window, or window.

The display device 320 may be disposed in a space between the first plate 310 and the second plate 370. The display device 320 may be disposed on, or combined with, the bottom of the first plate 310 and may be exposed through at least a portion of the first plate 310. The display device 320 may output contents (e.g., text, an image, a video, an icon, a widget, or a symbol), or may receive an input (e.g., a touch input or an electronic pen input) from the user.

The display device 320 may include a display panel, a touch sensor, and/or an electronic pen sensor. The display panel may include an LCD panel, an LED display panel, an OLED display panel, a MEMS display panel, or an electronic paper display panel. The touch sensor may include a capacitive touch panel, a pressure-sensitive touch panel, a resistive touch panel, an infrared touch panel, or an ultrasonic touch panel. The touch panel may be inserted into the display panel (e.g., an add-on touch panel), may be directly formed on the display panel (e.g., an on-cell touch panel), or may be included in the display panel (e.g., an in-cell touch panel). The electronic pen sensor (e.g., a digitizer) may detect a touch input, a gesture input, or a hovering input from an electronic pen.

The display device 320 may include a planar area 321 and a bending area 322 extending from one side (e.g., an upper side, a lower side, a left side, or a right side) of the planar area 321. Pixels (e.g., OLEDs) of the display panel, a conductive pattern of the touch sensor, and/or a conductive pattern of the electronic pen sensor may be disposed in the planar area 321. The bending area 322 may be electrically connected with an FPCB 325 on a rear surface of the display device 320 through various conductive patterns such as interconnection wires.

A portion of the bending area 322 may be folded toward a rear surface of the planar area 321. Interconnection wiring of the FPCB 325 may pass by a side surface of the support member 330 and may be electrically connected to the PCB 340 (e.g., a main PCB 340m) through a specified connector. The bending area 322 may have pixels disposed therein for displaying various pieces of information, similar to the planar area 321.

The front hardware module 327 may include various elements, such as a fingerprint sensor, a camera module, a proximity sensor, an iris sensor, and a receiver, which are arranged toward a front surface of the electronic device 301. The front hardware module 327 may be disposed below the display device 320. The front hardware module 327 may be disposed between a specified area of the display device 320 and the second plate 370 and may be arranged toward the first plate 310.

The support member 330 (e.g., a bracket) may be formed of metal or a polymer. The support member 330 may be disposed between the display device 320 and the PCB 340. The support member 330 may be combined with the display device 320 and the PCB 340 to physically support the display device 320 and the PCB 340. A swelling gap may be formed in the support member 330 to support swelling of the battery 360 depending on a secular change.

The PCB 340 may include the main PCB 340m and a sub-PCB 340s. The main PCB 340m and the sub-PCB 340s may be disposed below the support member 330 and may be electrically connected together through a specified connector or specified interconnection wiring. The PCBs 340m and 340s may be implemented with a rigid PCB and/or an FPCB. Various electronic components, elements, and printed circuits of the electronic device 301 may be mounted or arranged on the PCBs 340m and 340s. The PCBs 340m and 340s may be referred to as a main board, a printed board assembly (PBA), or simply a PCB.

The side member 350 may be disposed between the PCB 340 and the second plate 370 to accommodate elements of the electronic device 301. The side member 350 may be combined with the support member 330 or the second plate 370 of the electronic device 301. The side member 350 may surround the space between the first plate 310 and the second plate 370. A hole 351 extending toward the interior of the side member 350 may be formed in a portion of the side member 350. An electronic pen (stylus pen) 302 may be accommodated in the hole 351.

The battery 360 may supply the electrical energy to the display device 320 and various elements or modules mounted on the PCB 340. The battery 360 may also be rechargeable and store energy from external sources. A power management module for managing charge/discharge of the battery 360 may be included in the PCB 340.

The second plate 370, such as a back cover of the electronic device 301, may be combined with a rear surface of the electronic device 301. The second plate 370 may be formed of reinforced glass, a plastic injection-molded material, and/or metal. The second plate 370 may be implemented integrally with the side member 350, or may be implemented to be detachable by the user. The second plate 370 may also be referred to as a back cover, a rear case or a rear plate.

Figure 4:
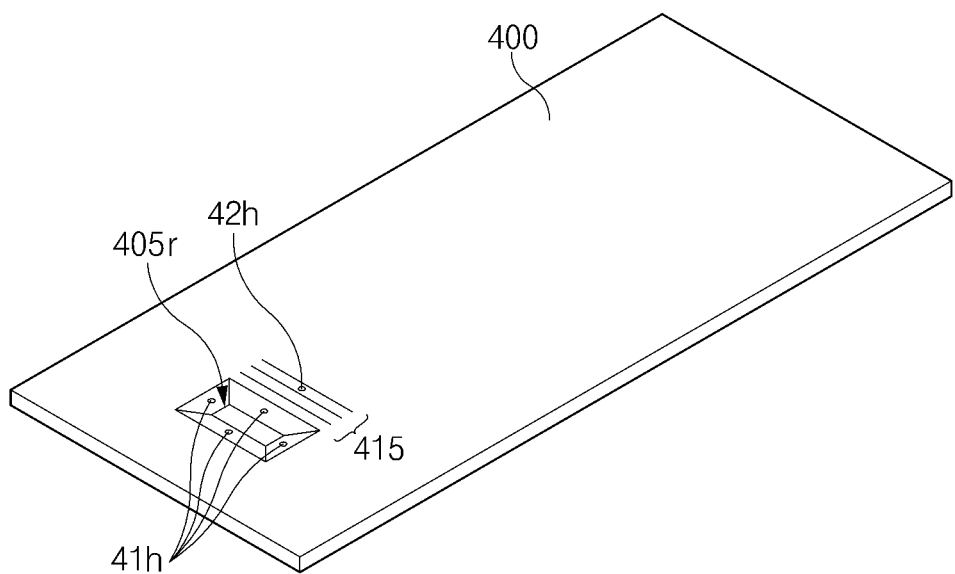
FIG. 4 is a diagram of a layer according to an embodiment.

FIG. 4 is a diagram of a layer according to an embodiment.

Referring to FIG. 4, a layer 400 may be disposed inside an electronic device such as those described herein. The layer 400 may be disposed to face a surface (e.g., a second surface) opposite to a surface (e.g., a first surface) of a display panel on which a plurality of pixels are arranged. The layer 400 may be disposed below the display device 320 illustrated in FIG. 3.

The layer 400 may include an FPCB having a specified conductive pattern formed thereon. The layer 400 may configure an electronic pen sensor having a conductive pattern that includes a first plurality of conductive lines extending parallel to one another and a second plurality of conductive lines extending perpendicular to the first plurality of conductive lines, but the layer 400 is not limited thereto.

A sunken area or a recessed portion 405r (e.g., a first portion) may be formed in a partial area of the layer 400. Accordingly, the sunken area 405r may be closer to a back cover than the remaining portion (e.g., a second portion) of the layer 400 in which the sunken area 405r is not formed. The conductive pattern of the layer 400 may continuously extend in the sunken area 405r (e.g., the first portion) and the remaining or second portion in which the sunken area 405r is not formed.

The sunken area 405r may have the shape of a frustum of a pyramid. However, the shape of the sunken area 405r is not limited thereto. The sunken area 405r may have various shapes. A specified hardware module (e.g., a biometric sensor, a camera module, or a proximity sensor) may be placed and mounted in the sunken area 405r. A bumpy structure, or a grooved structure or a corrugated structure 415 may be formed on the periphery of the sunken area 405r. A hole 41h may be formed through an inner wall of the sunken area 405r. The corrugated structure 415 may have a hole 42h formed through a layer 400 in the thickness direction. Air may pass through the holes 41h and 42h, and therefore the holes 41h and 42h may be referred to as air holes. Multiple holes may be formed through multiple layers.

Figure 5A:
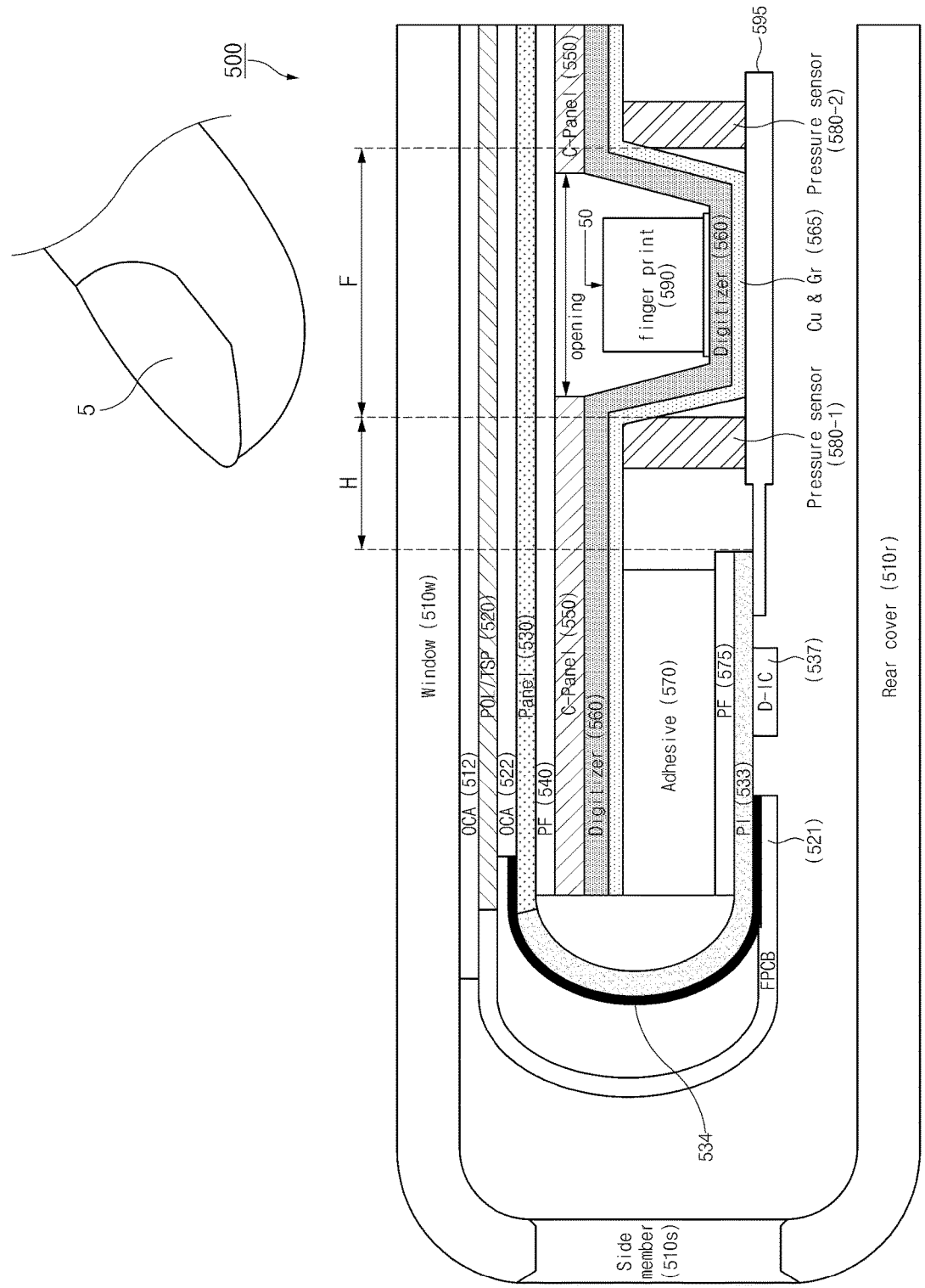
FIG. 5A is a diagram of an arrangement structure of a hardware module according to an embodiment.

FIG. 5A is a diagram of an arrangement structure of a hardware module according to an embodiment.

Referring to FIG. 5A, an electronic device 500 may include a cover glass 510w, a side member 510s, a back cover 510r, optically clear adhesives (OCAs) 512 and 522, a polarization layer (POL)/touch sensor (TSP) 520, an FPCB 521, a display panel 530, a polyimide (PI) film 533, a bending protect layer (BPL) 534, a display driver IC (D-IC) 537, protection films (PFs) 540 and 575, a C-panel 550, an electronic pen sensor 560, a shielding sheet 565, an adhesive layer 570, pressure sensors 580-1 and 580-2, a fingerprint sensor 590, and an FPCB 595. The electronic device 500 may include some or all of the elements illustrated in FIG. 5A and may additionally include elements not being illustrated in FIG. 5A. Among the elements illustrated in FIG. 5A, adjacent elements may be attached to each other by an adhesive tape.

The cover glass 510w may pass light generated by the display panel 530. A user may touch the cover glass 510w with a part (e.g., a finger 5) of the user's body to provide a touch input to the electronic device 500.

The side member 510s and the back cover 510r may be combined with the cover glass 510w to form a housing. The side member 510s, the cover glass 510w and the back cover 510r may correspond to the side member 350, the first plate 310 and the second plate 370 shown in FIG. 3.

The polarization layer/touch sensor 520 may be attached to the cover glass 510w by the OCA 512. A polarization layer or film included in the polarization layer/touch sensor 520 may prevent reflection of external light to improve visibility in bright places, such as the outdoors. The polarization layer may include a polyethylene terephthalate (PET) film or a tri-acetyl cellulose (TAC) film. A touch sensor included in the polarization layer/touch sensor 520 may detect a touch on the cover glass 510w.

The FPCB 521 may include interconnection wiring for supplying scan signals to the touch sensor included in the polarization layer/touch sensor 520. The FPCB 521 may be connected to one side of the polarization layer/touch sensor 520 and may be folded toward a rear surface of the polarization layer/touch sensor 520.

The display panel 530 may be attached to the polarization layer/touch sensor 520 by the OCA 522. The display panel 530 may include scan lines, data lines, OLEDs for generating light based on signals supplied from the scan lines and the data lines, a substrate (e.g., a low-temperature poly silicon (LTPS) substrate) on which the light-emitting diodes are arranged, and a thin film encapsulation (TFE) for protecting the light-emitting diodes. The light-emitting diodes may configure pixels. A plurality of pixels may be arranged on any one surface of the display panel 530 (e.g., a surface facing the cover glass 510w).

The display panel 530 may be implemented integrally with the touch sensor included in the polarization layer/touch sensor 520 (an in-cell touch panel). The display panel 530 implemented integrally with the touch sensor may be referred to as a touch screen display. With a touch screen display, the FPCB 521 may be omitted, and the interconnection wiring connected to the touch sensor may be included in the PI film 533.

The PI film 533 may be included as a part of the display panel 530, or may be connected to the display panel 530. The PI film 533 may include interconnection wiring for supplying electric power and/or signals to the display panel 530. The PI film 533 may be folded toward a rear surface of the display panel 530.

The BPL 534 may be attached to a bent area of the PI film 533. The BPL 534 may prevent a fracture in the bent area of the PI film 533.

The display driver IC 537 may control an operation of the display panel 530. The display driver IC 537 may receive image data from a processor (a host) and may supply signals corresponding to the image data to the display panel 530 based on a preset number of frames. The display driver IC 537 may be disposed on a surface of a planar area of the PI film 533.

The protection films (PFs) 540 and 575 may be attached to the display panel 530 and/or the PI film 533 to protect the display panel 530 and/or the PI film 533.

The C-panel (or back panel) 550 may be formed (or disposed) below the protection film 540. The C-panel 550 may include a light-shielding layer (e.g., an EMBO layer) for shielding light generated by the display panel 530 or light incident from the outside and/or a buffer layer (e.g., a sponge layer) for alleviating pressure from the outside.

An opening may be formed in an area of the C-panel 550 that corresponds to the fingerprint sensor 590 above the fingerprint sensor 590. The user's fingerprint may be recognized by the fingerprint sensor 590 through the opening. Light generated by the display panel 530 may be reflected by the fingerprint of the finger 5, and the reflected light may pass through the cover glass 510w, the OCA 512, the polarization layer/touch sensor 520, the OCA 522, the display panel 530, and the protection film 540 and may reach the fingerprint sensor 590 through the opening. The fingerprint sensor 590 may use at least one of the plurality of pixels included in the display panel 530 as a light source.

The electronic pen sensor 560 (e.g., a digitizer) may include a conductive pattern for receiving an input from the electronic pen 202 (e.g., a stylus pen) based on electromagnetic induction. The conductive pattern may be formed on an FPCB, and the FPCB may be included in the electronic pen sensor 560.

The shielding sheet 565 may be attached to a rear surface of the electronic pen sensor 560. The shielding sheet 565 may be a sheet to which metal magnetic powder containing copper (Cu)-graphite (Gr) is fused. The shielding sheet 565 may shield electro-magnetic waves propagating from above or below the shielding sheet 565, or may diffuse heat generated from other elements.

A sunken area 50 may be formed in a specified area of the electronic pen sensor 560 and the shielding sheet 565 (e.g., in an area corresponding to a second area of the display panel 530). The sunken area 50 (a second portion) may be closer to the back cover 510r than the remaining portion (a first portion) of the electronic pen sensor 560 in which the sunken area 50 is not formed. The specified area (the second area of the display panel 530) may correspond to an area F and/or the opening of the C-panel 550. The fingerprint sensor 590 may be placed in the sunken area 50. The sunken area 50 may be positioned such that the fingerprint sensor 590 is disposed between the sunken area 50 and the display panel 530.

The adhesive layer 570 may be used to stick the shielding sheet 565 and the protection film 575 together. The adhesive layer 570 may physically support the elements above and below the adhesive layer 570.

The pressure sensors 580-1 and 580-2 may detect pressure exerted by an external input (e.g., a touch input or an electronic pen input) on the cover glass 510w. The pressure sensor 580-1 may be disposed in an inner space corresponding to an area H. The area H may correspond to an area where the display panel 530 displays a symbol representing a home button.

The fingerprint sensor 590 may capture a fingerprint image of the finger 5. The fingerprint sensor 590 may correspond to an optical fingerprint sensor. The fingerprint sensor 590 may capture the fingerprint image by using an embedded image sensor (e.g., a CMOS or a CCD). In the fingerprint sensor 590, fingerprint minutiae unique to the fingerprint may be extracted from the fingerprint image. The fingerprint minutiae may include various minutiae points, such as ridge ending, crossover, bifurcation, pore, and the like, which are included in the fingerprint. The fingerprint minutiae may be compared with enrolled fingerprint minutiae for user authentication.

Light generated by the display panel 530 may be reflected by the fingerprint of the finger 5 located in the area F, and the reflected light may pass through the cover glass 510w, the OCA 512, the polarization layer/touch sensor 520, the OCA 522, the display panel 530, and the protection film 540 and may reach the fingerprint sensor 590 through the opening of the C-panel 550. The fingerprint sensor 590 may capture a fingerprint image by receiving the reflected light.

The FPCB 595 may include interconnection wiring related to the elements illustrated in FIG. 5A. The FPCB 595 may correspond to the FPCB 325 illustrated in FIG. 3. The interconnection wiring of the FPCB 595 may pass by a side surface of the support member 330 illustrated in FIG. 3 and may be electrically connected to the PCB 340 (e.g., the main PCB 340m) through a specified connector.

Figure 5B:
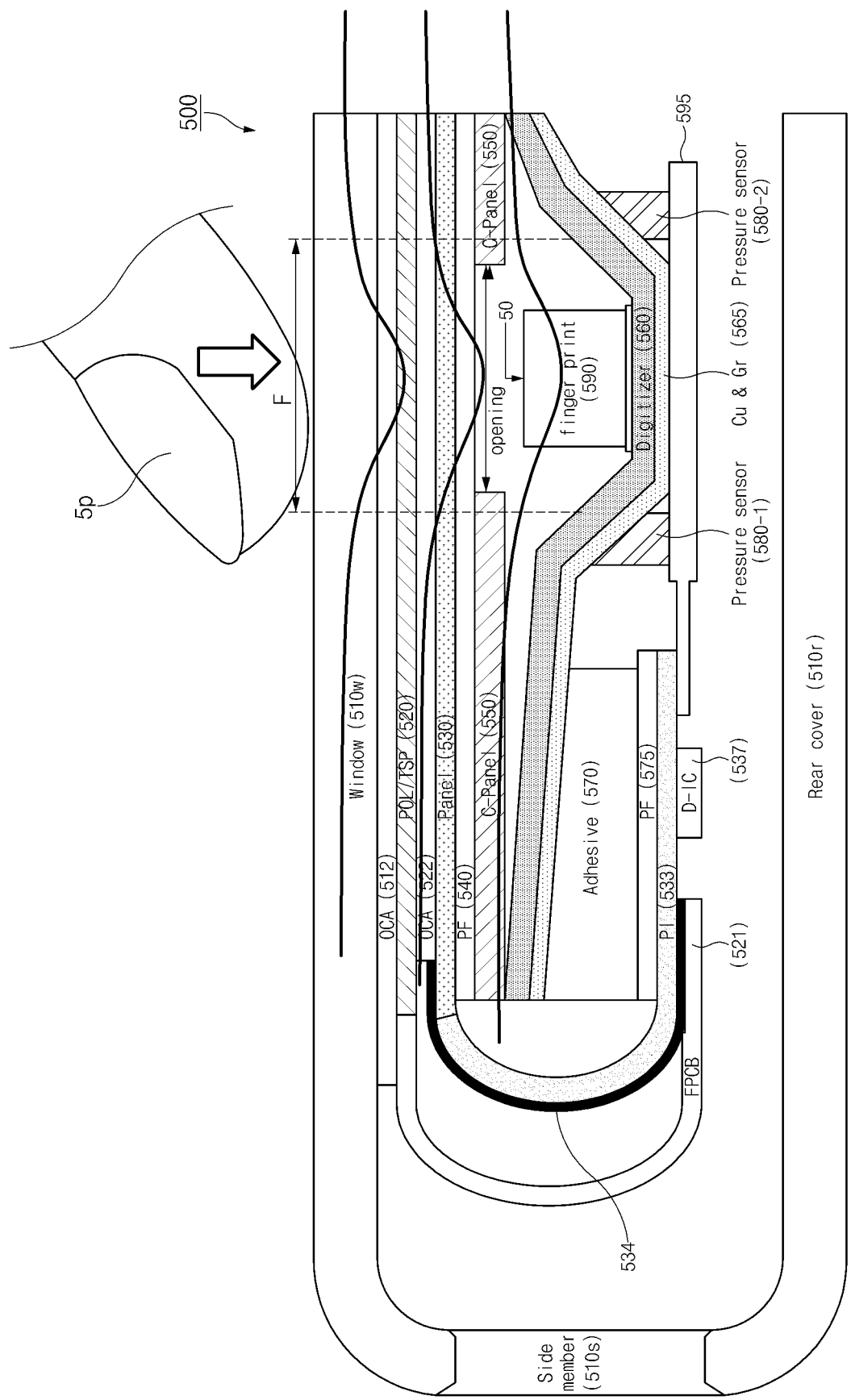
FIG. 5B is a diagram depicting a sunken area according to an embodiment.

FIG. 5B is a diagram depicting a sunken area according to an embodiment.

Referring to FIG. 5B, a user may touch the area F of the cover glass 510w with a finger 5p for fingerprint verification. In the case where the user touches the area F with the finger 5p, pressure exerted by the finger 5p may be transmitted from the cover glass 510w to the pressure sensors 580-1 and 580-2 via the electronic pen sensor 560 and the shielding sheet 565, and a pressure value may be detected by the pressure sensors 580-1 and 580-2.

The sunken area 50 may be formed on the electronic pen sensor 560 and the shielding sheet 565 to correspond to the area F. Inner walls and the periphery of the sunken area 50 may be elastically deformed within an elastic limit of the combined body by the pressure exerted by the finger 5p. When the user takes the finger 5p off the cover glass 510w and therefore the pressure exerted by the finger 5p is released, the electronic pen sensor 560 and the shielding sheet 565 may return to the original state illustrated in FIG. 5A.

As depicted in FIGS. 5A and 5B, a sunken area may be formed on an electronic pen sensor and a shielding sheet, and a fingerprint sensor may be placed in the sunken area. The electronic pen sensor may receive an input from an electronic pen through the bottom (and/or inner walls) of the sunken area. Accordingly, functions of the fingerprint sensor and the electronic pen sensor may not be affected even though the fingerprint sensor is disposed below a display panel.

Figure 6:
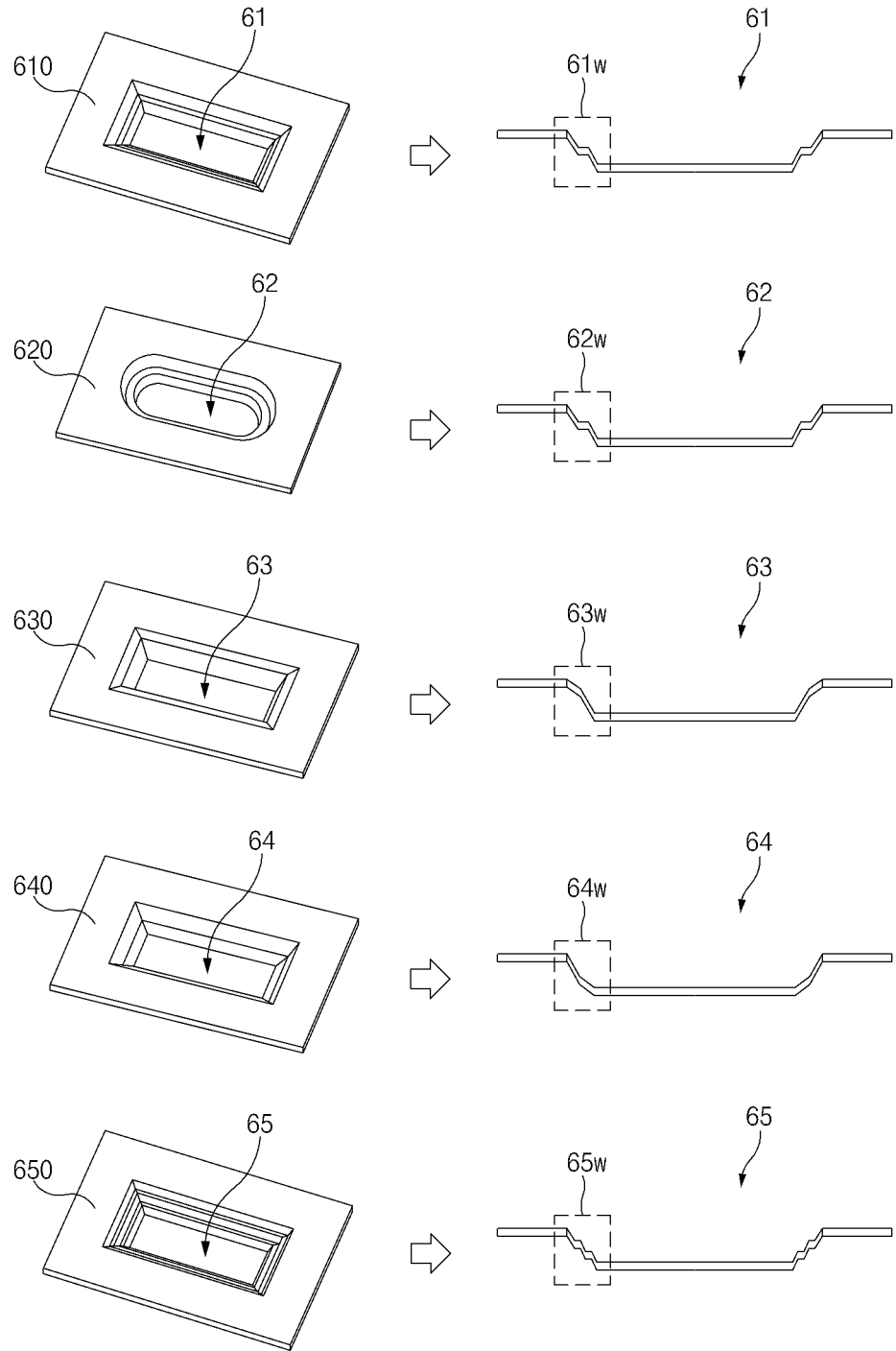
FIG. 6 is a diagram of sunken areas according to an embodiment.

FIG. 6 is a diagram of sunken areas according to an embodiment.

Referring to FIG. 6, layers 610, 620, 630, 640, and 650 include sunken areas 61, 62, 63, 64, and 65 respectively. The layers 610, 620, 630, 640, and 650 may be FPCBs having specified conductive patterns formed thereon. The layers 610, 620, 630, 640, and 650 may correspond to an electronic pen sensor 560, a shielding sheet 565), or a combination of the electronic pen sensor 560 and the shielding sheet 565.

An inner wall 61w of the sunken area 61 formed on the layer 610 may have a horizontal step. The cross section of the sunken area 61 may have a rectangular shape, and the cross sectional area may decrease toward the bottom of the sunken area 61 due to the step.

An inner wall 62w of the sunken area 62 formed on the layer 620 may have a step, similarly to the inner wall 61w of the sunken area 61. The cross section of the sunken area 62 may have an oval shape or a pill shape, and the cross sectional area may decrease toward the bottom of the sunken area 62 due to the step.

An inner wall 63w of the sunken area 63 formed on the layer 630 may have a step. The cross section of the sunken area 63 may have a rectangular shape, and the cross sectional area may decrease toward the bottom of the sunken area 63 due to the step. The step on the inner wall 63w may be convex toward the interior of the sunken area 63.

An inner wall 64w of the sunken area 64 formed on the layer 640 may have a step. The cross section of the sunken area 64 may have a rectangular shape, and the cross sectional area may decrease toward the bottom of the sunken area 64 due to the step. The step on the inner wall 64w may be convex toward outside of the sunken area 64.

An inner wall 65w of the sunken area 65 formed on the layer 650 may have two or more horizontal steps. The cross section of the sunken area 65 may have a rectangular shape, and the cross sectional area may decrease toward the bottom of the sunken area 65 due to the step.

The various forms of sunken areas 61, 62, 63, 64, and 65 illustrated in FIG. 6 are merely illustrative, and the disclosure is not limited thereto. Although the cross sections of the sunken areas 63, 64, and 65 formed on the layers 630, 640, and 650 have been described as having a rectangular shape, the cross sections of the sunken areas 63, 64, and 65 may have an oval shape or a pill shape, similar to the sunken area 62 of the layer 620. The inner walls 61w, 62w, 63w, 64w, and 65w of the sunken areas 61, 62, 63, 64, and 65 respectively may have air holes formed through the inner walls 61w, 62w, 63w, 64w, and 65w.

At least one step may be formed on the inner walls 61w, 62w, 63w, 64w, and 65w of the sunken areas 61, 62, 63, 64, and 65 respectively. The step(s) may be formed by performing "3D forming" two or more times. Performing of the "3D forming" two or more times may reduce creases around the sunken areas, compared to performing "3D forming" once to form a sunken area with the same depth.

Figure 7:
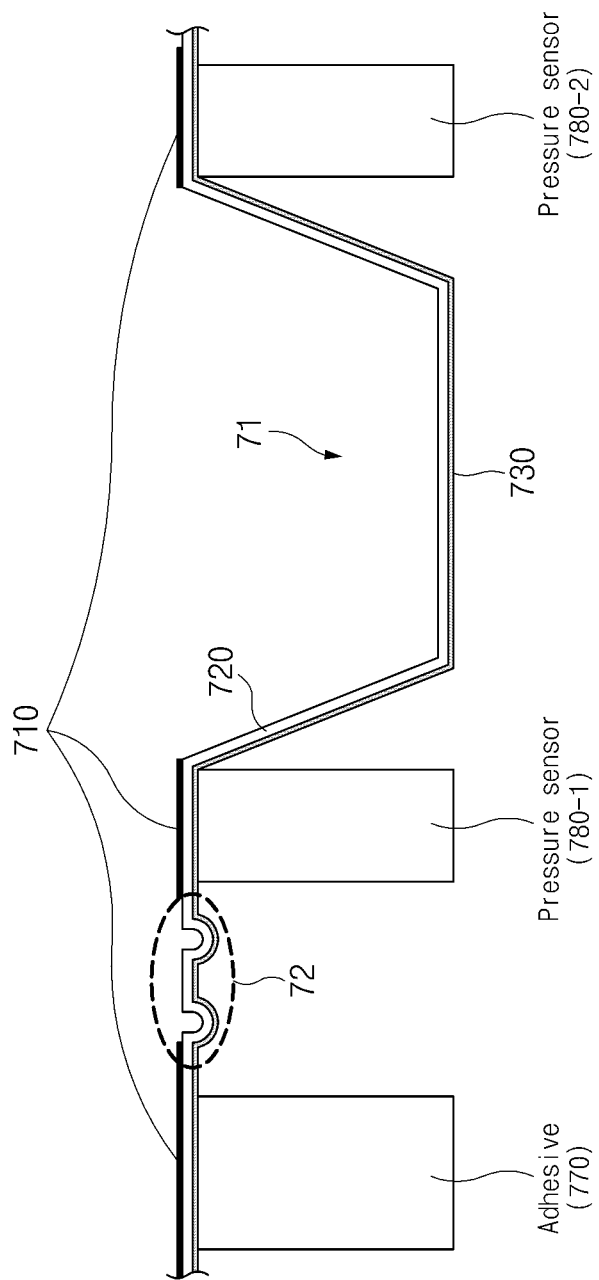
FIG. 7 is a diagram depicting a corrugated structure according to an embodiment.

FIG. 7 is a diagram depicting corrugated structure according to an embodiment.

A sunken area 71 may be formed on an electronic pen sensor 720 and a shielding sheet 730 of an electronic device. Pressure sensors 780-1 and 780-2 may be disposed around the sunken area 71 and be located below the shielding sheet 730. An adhesive tape 710 may be used to adhere a C-panel and the electronic pen sensor 720 together. An adhesive layer 770 may be used to stick the shielding sheet 730 and a protection film together.

A corrugated structure 72 may be formed in an area of the electronic pen sensor 720 and an area of the shielding sheet 730 that correspond to an area where a home button symbol is displayed (e.g., the area H of FIG. 5A). The areas where the corrugated structure 72 is formed may be adjacent to the pressure sensor 780-1.

The corrugated structure 72 may be elastically deformed by pressure applied from above the corrugated structure 72. The elastic deformation may alleviate tensile stress in the corrugated structure 72 to contribute to an improvement in durability of the members.

Figure 8:
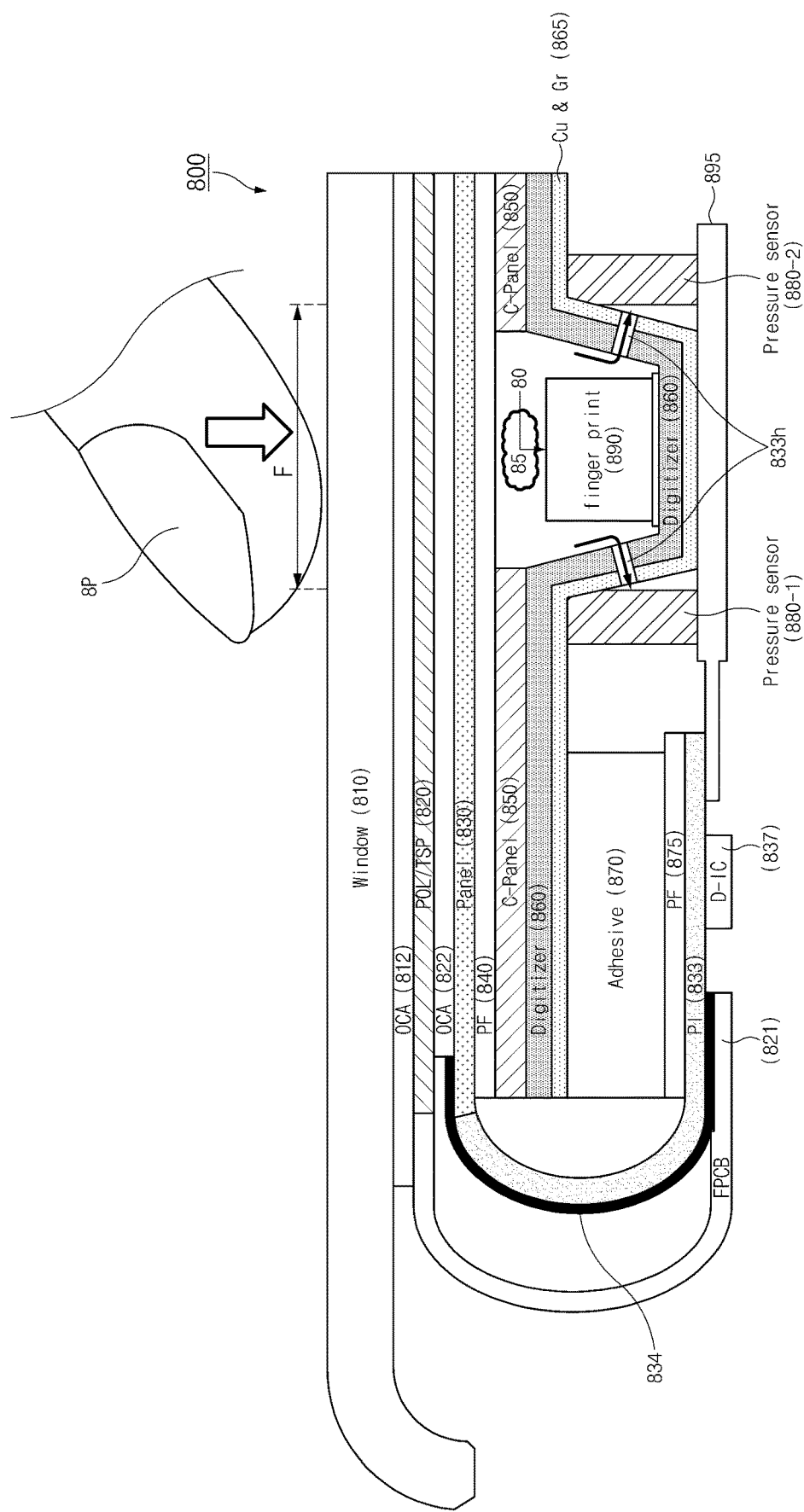
FIG. 8 is a diagram depicting an air hole according to an embodiment.

FIG. 8 is a diagram depicting an air hole according to an embodiment.

Referring to FIG. 8, an electronic device 800 may include a cover glass 810, OCAs 812 and 822, a polarization layer/touch sensor 820, an FPCB 821, a display panel 830, a PI film 833, a BPL 834, a display driver IC 837, protection films (PFs) 840 and 875, a C-panel 850, an electronic pen sensor 860, a shielding sheet 865, an adhesive layer 870, pressure sensors 880-1 and 880-2, a fingerprint sensor 890, and an FPCB 895.

A sunken area 80 may be formed on the electronic pen sensor 860 and the shielding sheet 865. The sunken area 80 may have at least one air hole 833h formed through the electronic pen sensor 860 and the shielding sheet 865 in the thickness direction.

A user may touch an area F of the cover glass 810 with a finger 8p for fingerprint verification. When the finger 8p touches the area F, pressure exerted by the finger 8p on the cover glass 810 may be transmitted to a space above the fingerprint sensor 890. Accordingly, air 85 occupying the space above the fingerprint sensor 890 may be instantaneously compressed by the pressure exerted by the finger 8p. The compressed air may be discharged through the air hole 833h formed in the electronic pen sensor 860 and the shielding sheet 865.

The user may take the finger 8p off the cover glass 810. In this case, the pressure of the air 85 occupying the space above the fingerprint sensor 890 may be decreased, and therefore external air may be introduced through the air hole 833h.

Figure 9A:
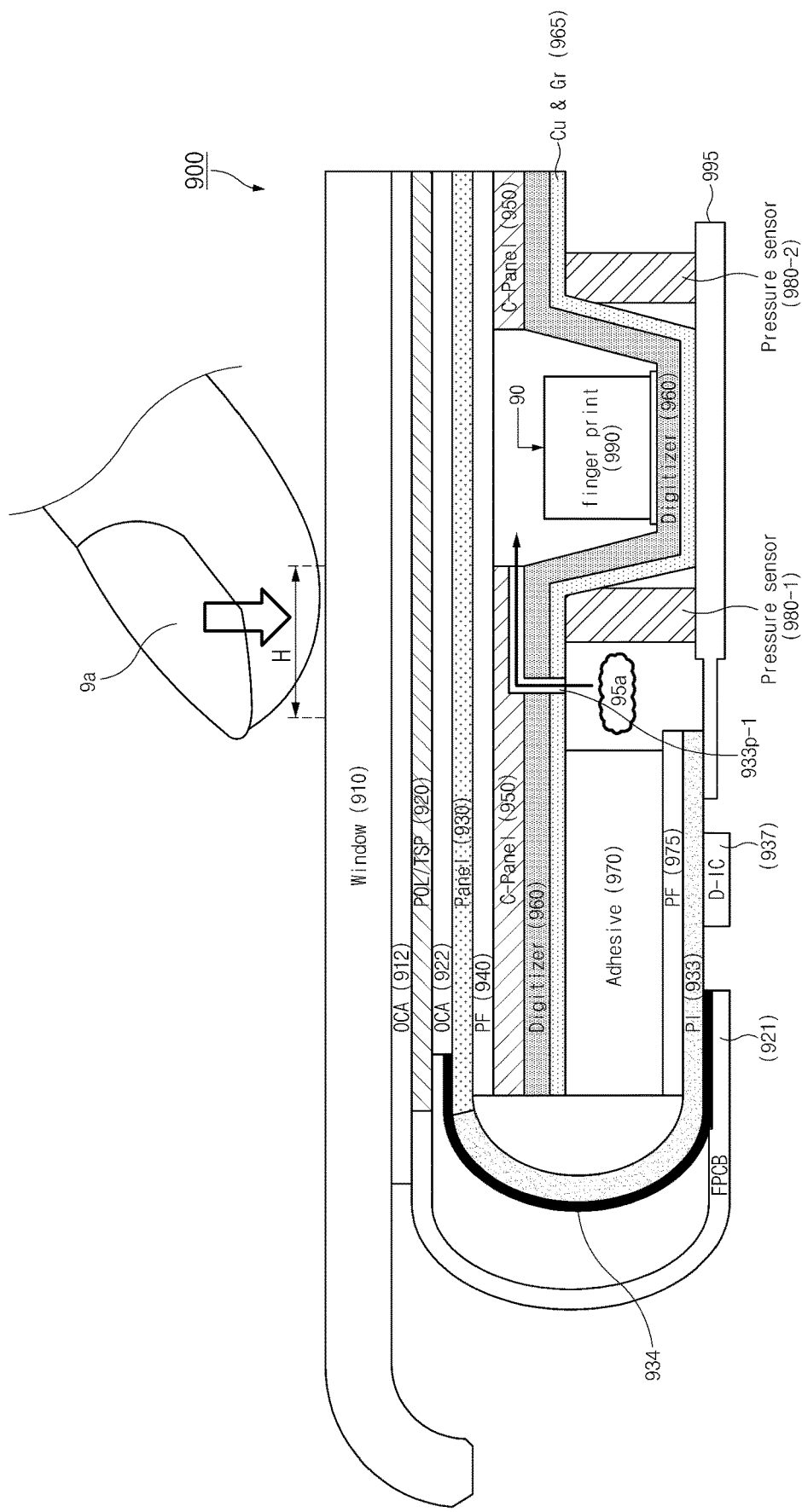
FIGS. 9A, 9B, and 9C are diagrams depicting air holes and air paths according to an embodiment.
Figure 9B:
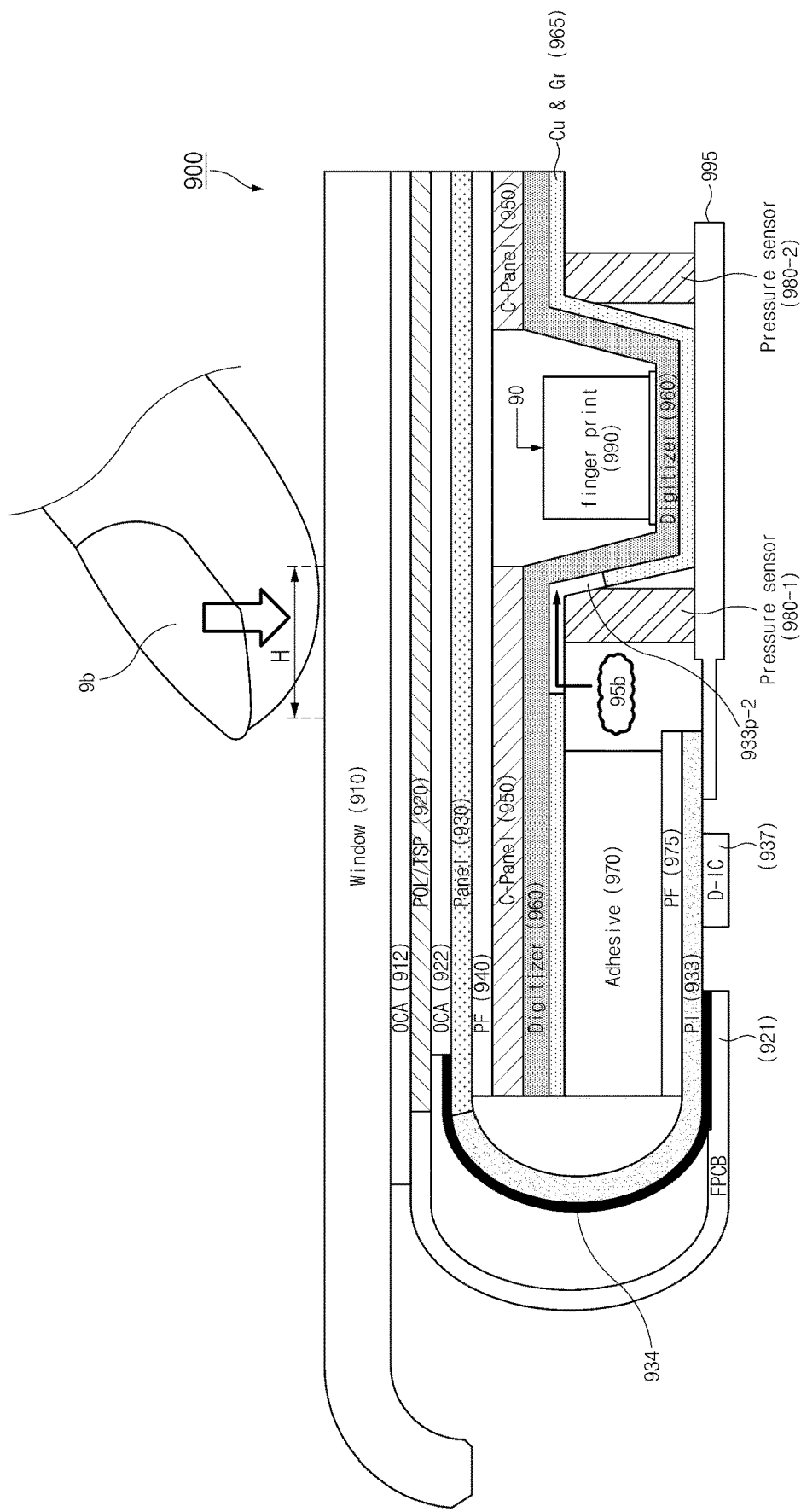
Figure 9C:
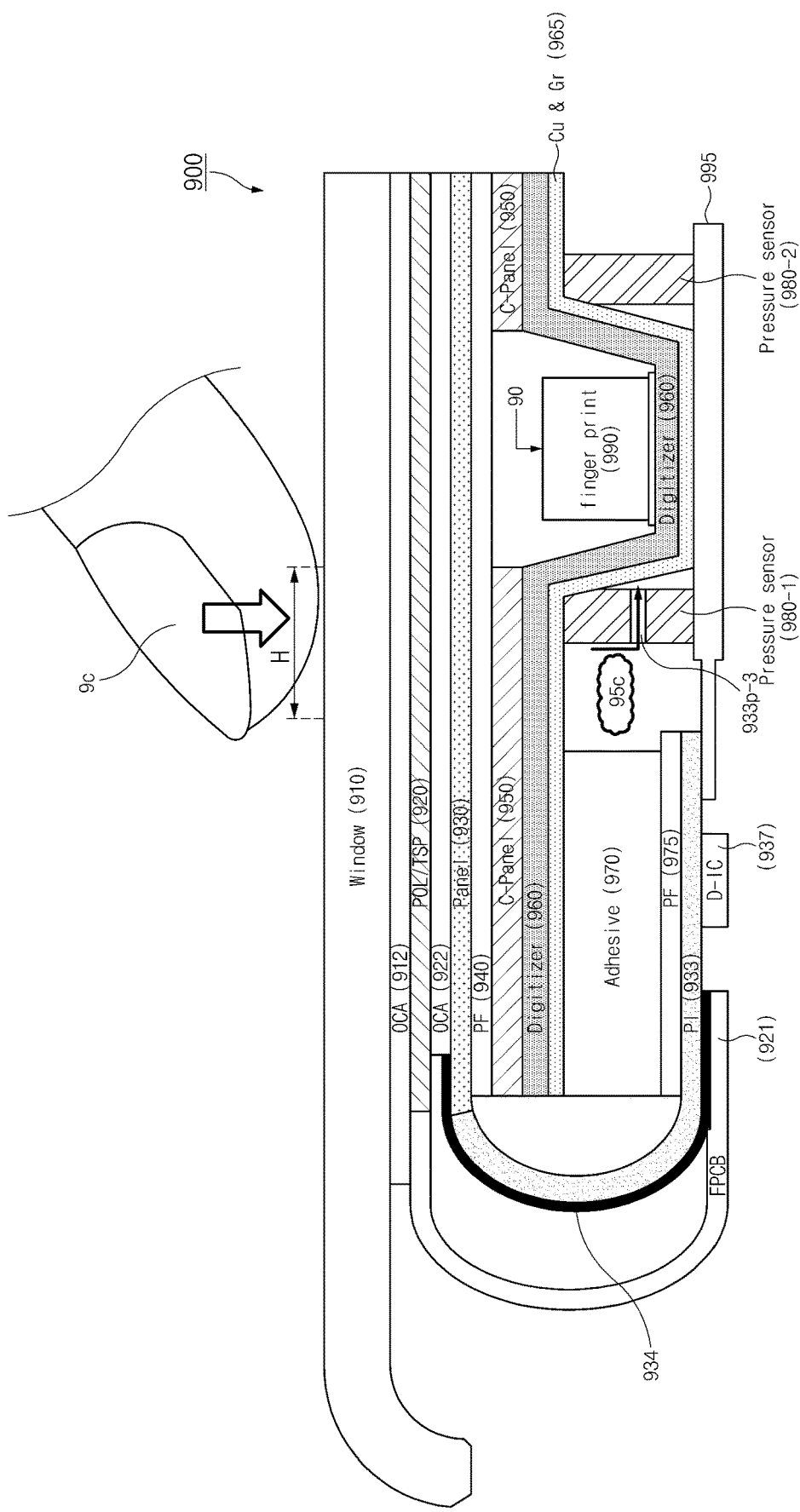

FIGS. 9A, 9B, and 9C are diagrams depicting air holes and air paths according to an embodiment.

Referring to FIGS. 9A, 9B, and 9C, an electronic device 900 may include a cover glass 910, OCAs 912 and 922, a polarization layer/touch sensor 920, an FPCB 921, a display panel 930, a PI film 933, a BPL 934, a display driver IC 937, protection films (PFs) 940 and 975, a C-panel 950, an electronic pen sensor 960, a shielding sheet 965, an adhesive layer 970, pressure sensors 980-1 and 980-2, a fingerprint sensor 990, and an FPCB 995.

Referring to FIG. 9A, a sunken area 90 may be formed on the electronic pen sensor 960 and the shielding sheet 965. An air hole may be formed through an area of the electronic pen sensor 960 and an area of the shielding sheet 965 that correspond to an area H. A groove or furrow in fluid communication with the air hole may be formed in the C-panel 950. The air hole and the groove or furrow may communicate the inside and outside of the sunken area 90. The air hole and the groove or furrow of the C-panel 950 that is in fluid communication with the air hole may serve as a path along which air flows and may be referred to as an air path.

A user may touch the area H with a finger 9a to select a home button symbol displayed in the area H. When the finger 9a touches the area H, pressure exerted by the finger 9a on the cover glass 910 may be transmitted to the pressure sensor 980-1. Accordingly, air 95a occupying a space around the pressure sensor 980-1 may be instantaneously compressed by the pressure exerted by the finger 9a. The compressed air 95a may be discharged through an air path 933p-1 formed in the shielding sheet 965, the electronic pen sensor 960, and the C-panel 950. The user may take the finger 9a off the cover glass 910. In this case, the pressure of the air 95a may be decreased, and therefore air in the sunken area 90 may be introduced through the air path 933p-1.

Referring to FIG. 9B, a groove or air path 933p-2 communicating spaces around the pressure sensor 980-1 may be formed in the shielding sheet 965. A user may touch the area H with a finger 9b to select the home button symbol displayed in the area H. When the finger 9b touches the area H, pressure exerted by the finger 9b on the cover glass 910 may be transmitted to the pressure sensor 980-1. Accordingly, air 95b occupying a space around the pressure sensor 980-1 may be instantaneously compressed by the pressure exerted by the finger 9b. The compressed air 95b may spread into a space around the pressure sensor 980-1 through the air path 933p-2 formed in the shielding sheet 965.

Referring to FIG. 9C, a groove or air path 933p-3 communicating spaces around the pressure sensor 980-1 may be formed in the pressure sensor 980-1. A user may touch the area H with a finger 9c to select the home button symbol displayed in the area H. When the finger 9c touches the area H, pressure exerted by the finger 9c on the cover glass 910 may be transmitted to the pressure sensor 980-1. Accordingly, air 95c occupying a space around the pressure sensor 980-1 may be instantaneously compressed by the pressure exerted by the finger 9c. The compressed air 95c may spread into a space around the pressure sensor 980-1 through the air path 933p-3 formed in the pressure sensor 980-1.

The air holes or the air paths shown in FIGS. 8, 9A, 9B, and 9C may provide a passage through which air compressed by the user's touch spreads into a different space in the electronic device. Accordingly, it is possible to improve a response speed of the pressure sensor disposed in the electronic device and to reduce resistance that the user feels when performing a force touch.

Figure 10:
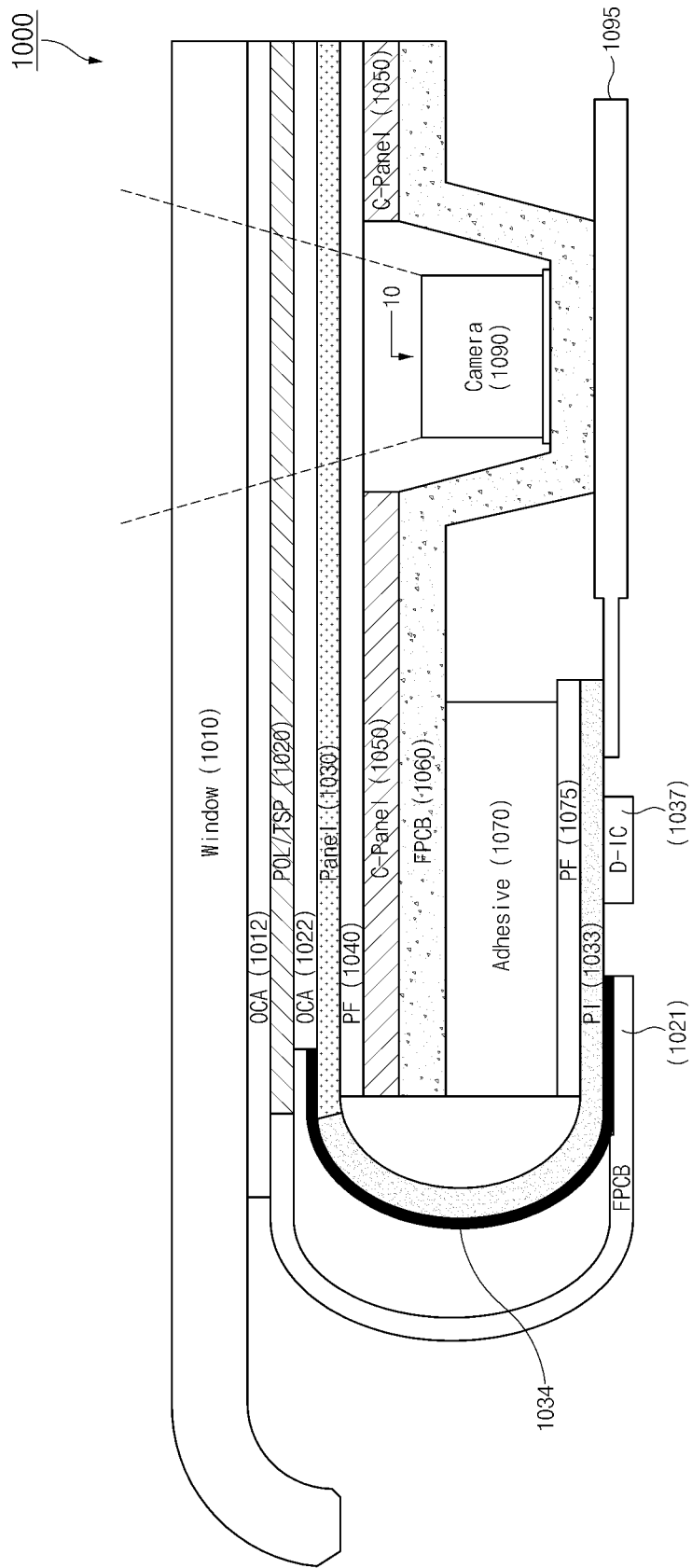
FIG. 10 is a diagram of an arrangement structure of a hardware module according to an embodiment.

FIG. 10 is a diagram of an arrangement structure of a hardware module according to an embodiment.

Referring to FIG. 10, an electronic device 1000 may include a cover glass 1010, OCAs 1012 and 1022, a polarization layer/touch sensor 1020, an FPCB 1021, a display panel 1030, a PI film 1033, a BPL 1034, a display driver IC 1037, protection films (PFs) 1040 and 1075, a C-panel 1050, an FPCB 1060, an adhesive layer 1070, a camera 1090, and an FPCB 1095.

An opening may be formed in an area of the C-panel 1050 that corresponds to the camera 1090 above the camera 1090. Since the cover glass 1010, the OCAs 1012 and 1022, the polarization layer/touch sensor 1020, the FPCB 1021, the display panel 1030, and the protection film 1040, which are stacked above the C-panel 1050, are implemented to be (substantially) transparent, the camera 1090 may capture an image based on light incident through the opening formed in the C-panel 1050.

The FPCB 1060 may be disposed below the C-panel 1050 and may be attached to the protection film 1075 through the adhesive layer 1070. A sunken area 10 may be formed on the FPCB 1060. The camera 1090 may be placed and mounted in the sunken area 10 formed on the FPCB 1060. The FPCB 1060 may include interconnection wiring related to the camera 1090.

Figure 11A:
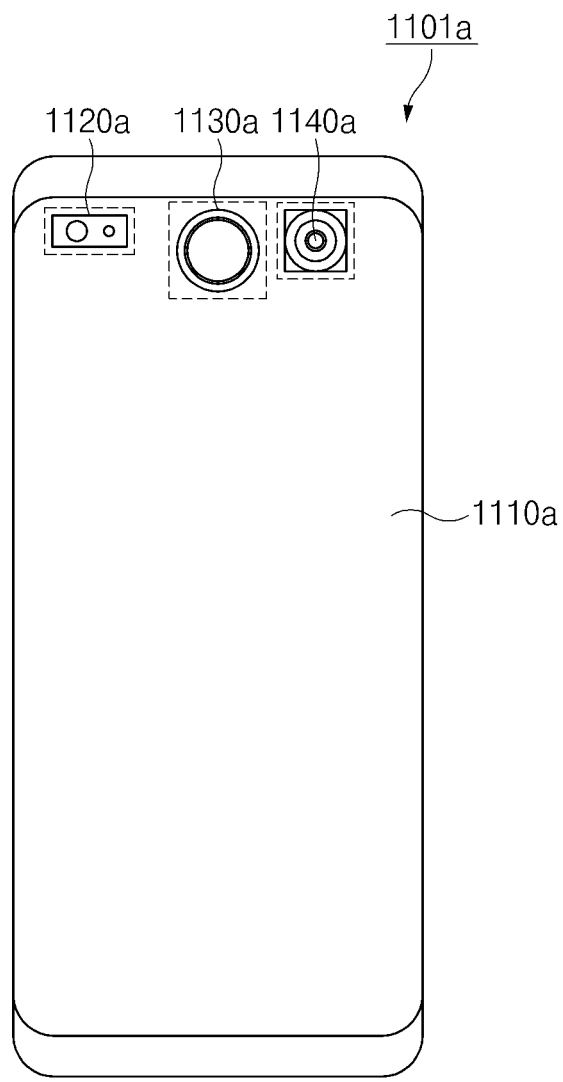
FIGS. 11A and 11B are diagrams of electronic devices to which a hardware module mounting structure is applied according to an embodiment.
Figure 11B:
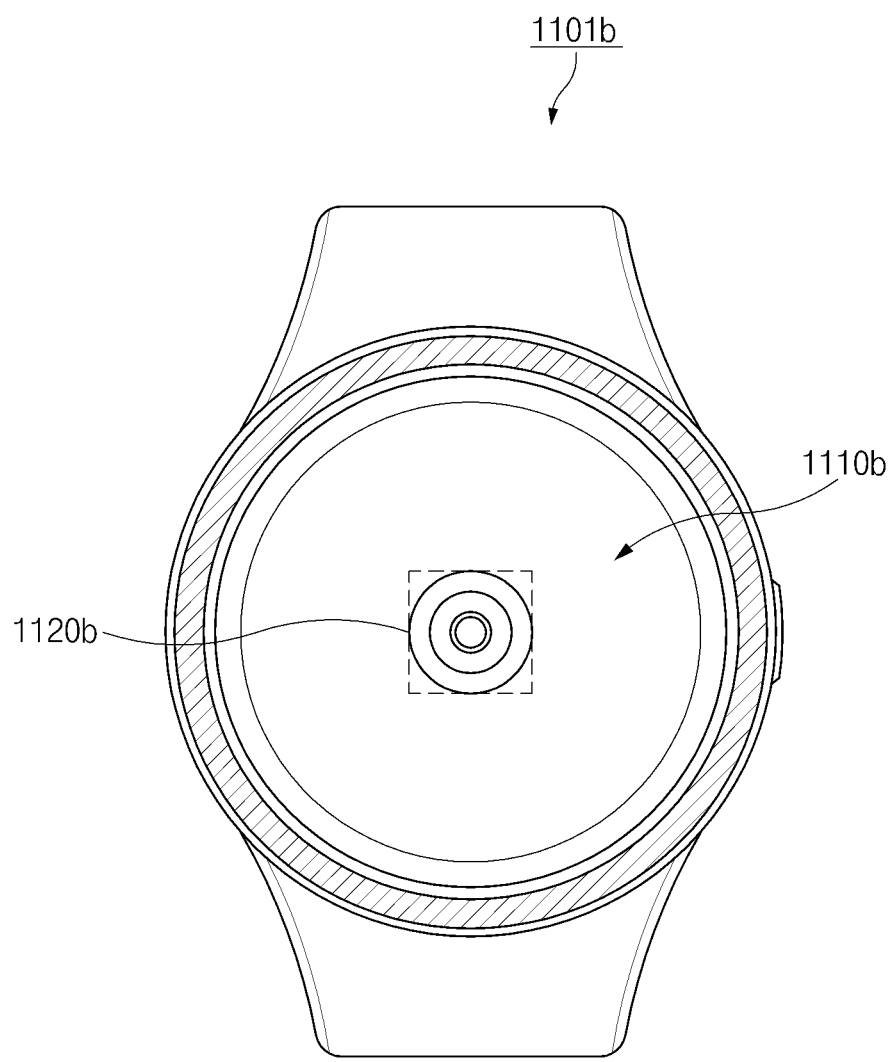

FIGS. 11A and 11B are diagrams of electronic devices to which a hardware module mounting structure is applied according to an embodiment.

Referring to FIG. 11A, hardware modules capable of being applied to a mounting structure are depicted. An electronic device 1101a may include a proximity sensor 1120a, a receiver (e.g., a piezoelectric speaker) 1130a, and a camera 1140a that are disposed below a display 1110a. Additional or alternative hardware modules may be applied to the mounting structure. For example, the electronic device 1101a may further include an iris sensor disposed on a front surface thereof.

The above-described various forms of hardware modules 1120a, 1130a, and 1140a may be mounted on an FPCB including interconnection wiring related to the hardware modules 1120a, 1130a, and 1140a. A sunken area may be formed on the FPCB, and the hardware modules 1120a, 1130a, and 1140a may be placed and mounted in the corresponding sunken area.

Referring to FIG. 11B, a wearable device (e.g., a smartwatch) 1101b may include a display 1110b. A hardware module 1120b (e.g., a camera, an iris sensor, or a fingerprint sensor) may be disposed below the display 1110b. The hardware module 1120b may be disposed on an FPCB including interconnection wiring related to the corresponding hardware module 1120b. A sunken area may be formed on the FPCB. The hardware module 1120b may be placed and mounted in the sunken area.

Figure 12:
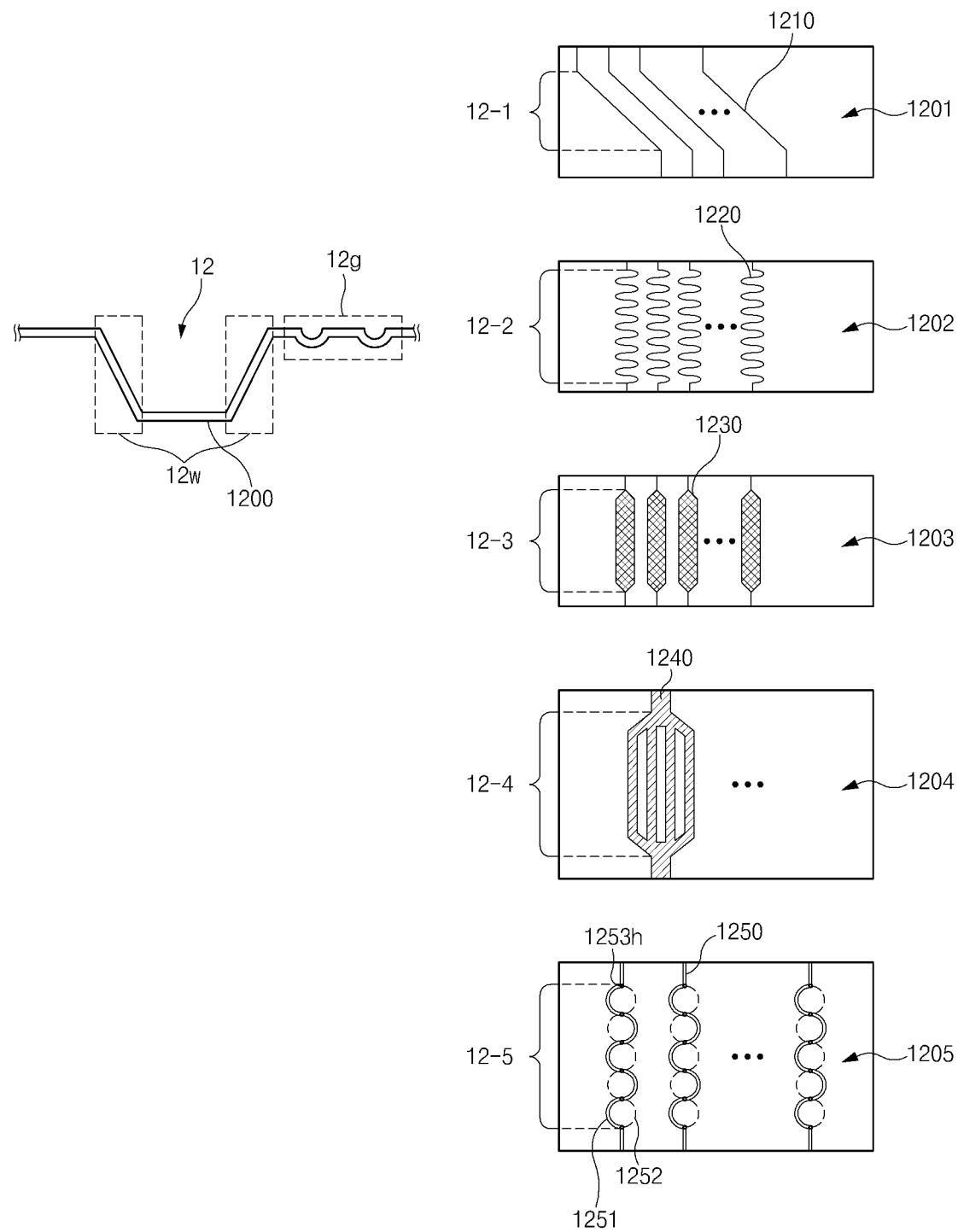
FIG. 12 is a diagram of conductive patterns according to an embodiment.

FIG. 12 is a diagram of conductive patterns according to an embodiment.

Referring to FIG. 12, a sunken area 12 may be formed on a layer 1200 (e.g., an electronic pen sensor, an FPCB, or the like). A modified conductive pattern (e.g., conductive lines 1210, 1220, 1230, 1240, or 1250) may be formed on a corrugated structure 12g formed on a partial area of the layer 1200 and/or an inner wall 12w of the sunken area 12. A three-dimensional structure, such as the corrugated structure 12g and/or the inner wall 12w, may be formed by a die press. A conductive line formed on at least a partial area of the corrugated structure 12g and/or the inner wall 12w may have a structure (e.g., 1210, 1220, 1230, 1240, or 1250) allowing tensile strain to prevent a problem of disconnection.

Referring to layer 1201, in an area 12-1 corresponding to the corrugated structure 12g and/or the inner wall 12w, a conductive line 1210 may extend at a specified angle (e.g., diagonally) with respect to the vertical direction. The conductive line 1210 extending at the specified angle may be stretched by an external force, and therefore a possibility of disconnection may be reduced.

Referring to layer 1202, in an area 12-2 corresponding to the corrugated structure 12g and/or the inner wall 12w, a conductive line 1220 may be twisted in zigzags. The twisted conductive line 1220 may be stretched with predetermined elasticity, and therefore a possibility of disconnection may be reduced.

Referring to layer 1203, in an area 12-3 corresponding to the corrugated structure 12g and/or the inner wall 12w, a conductive line 1230 may be formed to have a width greater than or equal to a specified thickness. Even though a tensile force is applied to the relatively thick conductive line 1230 in the longitudinal direction, there is room for reduction in thickness in the lateral direction, and therefore a possibility of disconnection may be reduced.

Referring to layer 1204, in an area 12-4 corresponding to the corrugated structure 12g and/or the inner wall 12w, a conductive line 1240 may branch into a plurality of conductive lines. According to the branch structure of the conductive line 1240, the conductive line 1240 may maintain an electrical connection even though some of the split conductive lines are disconnected (or crack) due to a longitudinal tensile force.

Referring to layer 1205, in an area 12-5 corresponding to the corrugated structure 12g and/or the inner wall 12w, a conductive line 1250 may branch into a first conductive branch line 1251 and a second conductive branch line 1252. The first conductive branch line 1251 and the second conductive branch line 1252 may be formed on the top and the bottom of the single layer 1205, respectively. The first conductive branch line 1251 and the second conductive branch line 1252 may be electrically connected through at least one via-hole 1253h.

The first conductive branch line 1251 and the second conductive branch line 1252 may be formed on separate layers, respectively. A first layer having the first conductive branch line 1251 formed thereon and a second layer having the second conductive branch line 1252 formed thereon may be stacked on each other, and the first conductive branch line 1251 and the second conductive branch line 1252 may be electrically connected through a via-hole.

In accordance with the branch structure of the conductive line 1250, the conductive line 1250 may maintain an electrical connection even though the first conductive branch line 1251 or the second conductive branch line 1252 is disconnected (or cracks) due to a longitudinal tensile force.

Figure 13A:
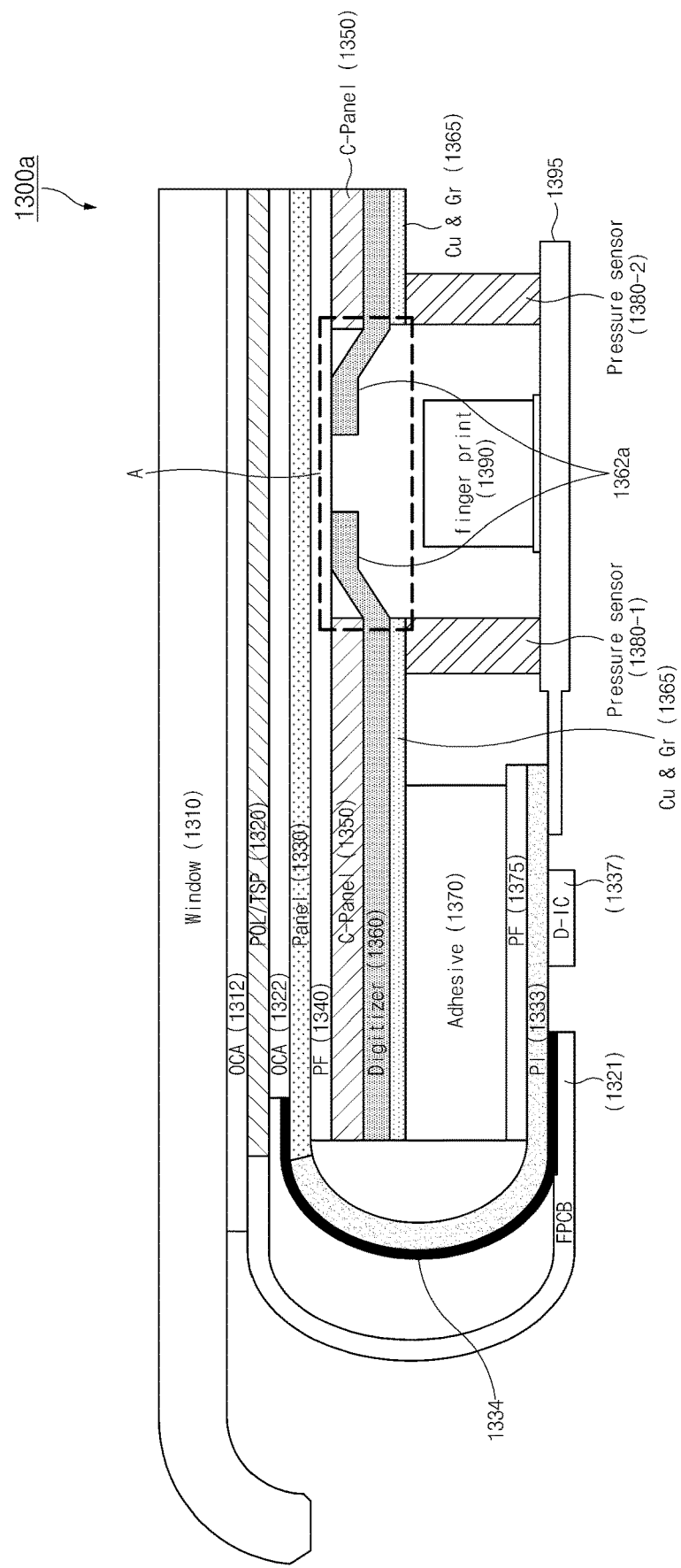
FIGS. 13A and 13B are diagrams of arrangement structures of hardware modules according to an embodiment.
Figure 13B:
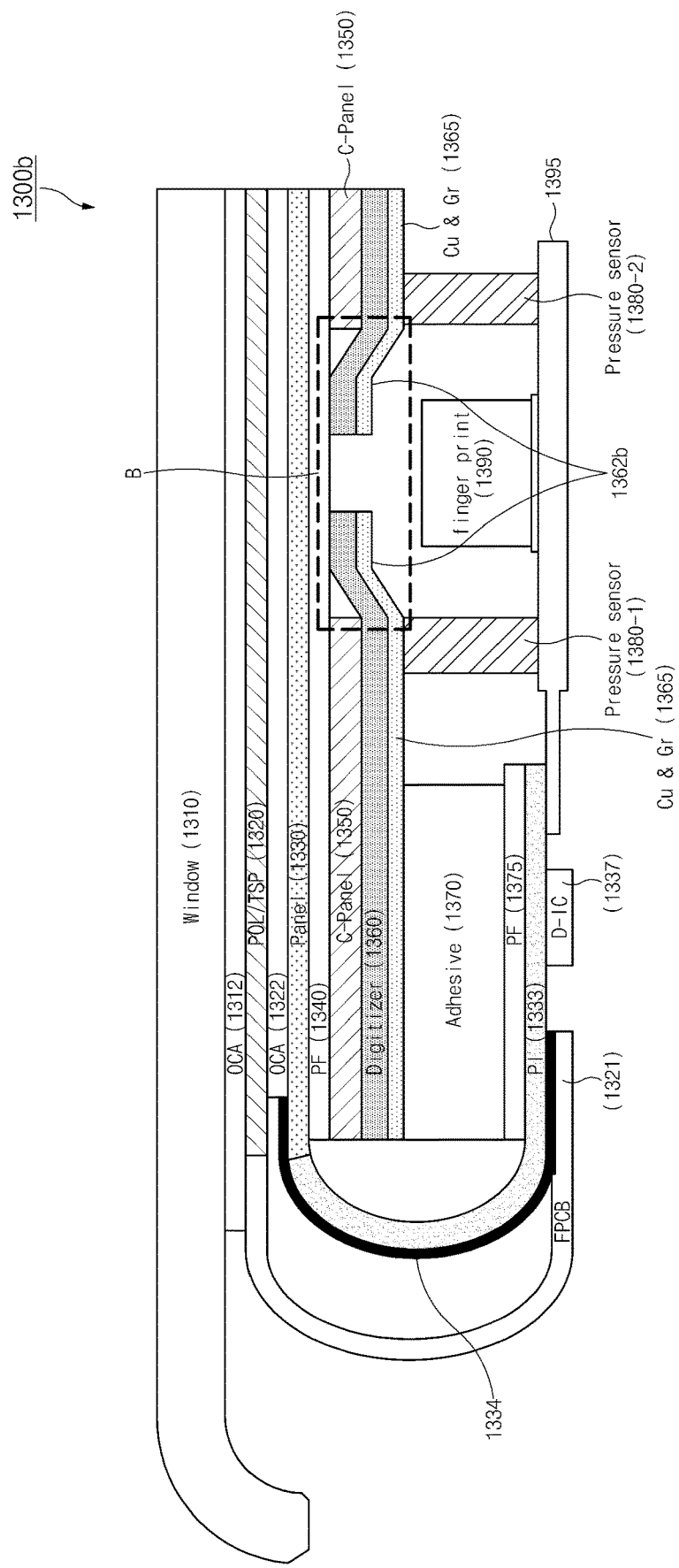

FIGS. 13A and 13B are diagrams of arrangement structures of hardware modules according to an embodiment.

Electronic devices 1300a and 1300b may include a cover glass 1310, OCAs 1312 and 1322, a polarization layer/touch sensor 1320, an FPCB 1321, a display panel 1330, a PI film 1333, a BPL 1334, a display driver IC 1337, protection films (PFs) 1340 and 1375, a C-panel 1350, an electronic pen sensor 1360, a shielding sheet 1365, an adhesive layer 1370, pressure sensors 1380-1 and 1380-2, a fingerprint sensor 1390, and an FPCB 1395.

Referring to electronic device 1300a, an opening A may be formed through an area of the C-panel 1350 and an area of the shielding sheet 1365 that correspond to the fingerprint sensor 1390 above the fingerprint sensor 1390. The electronic pen sensor 1360 disposed between the C-panel 1350 and the shielding sheet 1365 may have an overhang area 1362a that occupies a partial area of the opening A. The overhang area 1362a may be attached to a rear surface of the protection film (PF) 1340 to detect an electronic pen input or hovering over an area corresponding to the opening A. The fingerprint sensor 1390 may detect a fingerprint through an area of the opening A that is not hidden by the overhang area 1362a.

Referring to electronic device 1300b, an opening B may be formed in an area of the C-panel 1350 that corresponds to the fingerprint sensor 1390 above the fingerprint sensor 1390. The electronic pen sensor 1360 and the shielding sheet 1365 disposed below the C-panel 1350 may each have an overhang area 1362b that occupies a partial area of the opening B. The overhang area 1362b may be attached to the rear surface of the protection film (PF) 1340 to detect an electronic pen input or hovering over an area corresponding to the opening B. Likewise to the electronic pen sensor 1360, the shielding sheet 1365 of the electronic device 1300b may have the overhang area 1362b, unlike in the electronic device 1300a.

An electronic device according to an embodiment may include a housing including a first plate, a second plate facing away from the first plate, and a side member surrounding a space between the first plate and the second plate, a touch screen display disposed in the interior of the housing between the first plate and the second plate, a fingerprint sensor disposed between a first area of the touch screen display and the second plate and facing toward the first plate, a digitizer (or an electronic pen sensor) including a layer having a conductive pattern, a wireless communication circuit disposed in the interior of the housing, and a processor disposed in the interior of the housing and operatively connected to the touch screen display, the fingerprint sensor, the digitizer, and the wireless communication circuit. The layer included in the digitizer may include a first portion positioned between the second plate and a second area of the touch screen display that surrounds the first area when viewed from above the first plate and a second portion continuously extending from the first portion. The second portion may be positioned such that the fingerprint sensor is disposed between the second portion and the touch screen display. The second portion may be closer to the second plate than the first portion.

An electronic device according to another embodiment may further include a hole extending long from a portion of the side member. The hole may be configured to accommodate a stylus pen.

According to another embodiment, the conductive pattern may include a first plurality of conductive lines extending parallel to one another and a second plurality of conductive lines extending perpendicular to the first plurality of conductive lines.

According to another embodiment, the first plurality of conductive lines and the second plurality of conductive lines may continuously extend through the first portion and the second portion of the layer.

An electronic device according to an embodiment may include a housing including a first plate, a second plate facing away from the first plate, and a side member surrounding a space between the first plate and the second plate, a touch screen display disposed in the interior of the housing between the first plate and the second plate, a fingerprint sensor disposed between a first area of the touch screen display and the second plate and facing toward the first plate, a flexible printed circuit board (FPCB) including a layer having a conductive pattern, a wireless communication circuit disposed in the interior of the housing, and a processor disposed in the interior of the housing and operatively connected to the touch screen display, the fingerprint sensor, the FPCB, and the wireless communication circuit. The layer included in the FPCB 1060 may include a first portion positioned between a second area of the touch screen display and the second plate and a second portion continuously extending from the first portion. The second area may surround the first area when viewed from above the first plate. The second portion may be positioned such that the fingerprint sensor is disposed between the second portion and the touch screen display. The second portion may be closer to the second plate than the first portion.

According to another embodiment, the electronic device may further include pressure sensors disposed below the first portion of the layer and positioned adjacent to the second portion of the layer.

According to another embodiment, at least one hole may be formed through a transient portion that continuously extends from the second portion to the first portion.

According to another embodiment, a conductive line formed on the transient portion, which continuously extends from the second portion to the first portion, may allow tensile strain caused by an external force.

An electronic device according to an embodiment may include a display panel including a plurality of pixels on a first surface, a hardware module, and a layer disposed to face a second surface of the display panel that is opposite to the first surface. The hardware module may be disposed in a sunken area formed on the layer.

According to another embodiment, the hardware module may include at least one of a fingerprint sensor, a receiver, an iris sensor, and a proximity sensor.

According to another embodiment, the layer may include an electronic pen sensor.

According to another embodiment, the layer may include a shielding sheet.

According to another embodiment, at least one step may be formed on an inner wall of the sunken area.

According to another embodiment, the electronic device may further include a pressure sensor adjacent to an outer wall of the sunken area.

According to another embodiment, a hole may be formed through the pressure sensor.

According to another embodiment, at least one hole may be formed through an inner wall of the sunken area.

According to another embodiment, a groove in fluid communication with the sunken area may be formed in the layer.

According to another embodiment, a grooved structure or a corrugated structure may be formed in a specified area of the layer.

According to another embodiment, the specified area may correspond to an area of the display panel where a specified symbol is displayed.

According to another embodiment, the electronic device may further include a C-panel disposed on the layer. At least one hole may be formed through the specified area of the layer, and a groove in fluid communication with the hole may be formed in the C-panel.

According to another embodiment, a conductive line formed on a wall of the sunken area may allow tensile strain caused by an external force.

According to another embodiment, a conductive line may be twisted in zigzags on the wall.

According to another embodiment, a conductive line on the wall may have a width greater than or equal to a specified thickness.

According to another embodiment, a conductive line may include a first conductive branch line formed on a front surface of the wall and a second conductive branch line formed on a rear surface of the wall. The first conductive branch line and the second conductive branch line may be electrically connected through a via-hole 1253*h* formed through the wall.

While the disclosure has been shown and described with reference to certain embodiments thereof, it will be understood by those skilled in the art that various changes in form and details may be made therein without departing from the scope of the disclosure. Therefore, the scope of the disclosure should not be defined as being limited to the embodiments, but should be defined by the appended claims and equivalents thereof.

What is claimed is:

1. An electronic device comprising:
    a housing including a first plate, a second plate facing away from the first plate, and a side member surrounding a space between the first plate and the second plate;
    a touch screen display disposed in the housing between the first plate and the second plate;
    a fingerprint sensor disposed between a first area of the touch screen display and the second plate, the fingerprint sensor facing toward the first plate;
    a digitizer including a layer having a conductive pattern;
    a wireless communication circuit; and
    a processor operatively connected to the touch screen display, the fingerprint sensor, the digitizer, and the wireless communication circuit,
    wherein the layer includes:
        a first portion positioned between the second plate and a second area of the touch screen display that surrounds the first area when viewed from above the first plate; and
        a second portion continuously extending from the first portion,
    wherein the second portion is positioned such that the fingerprint sensor is disposed between the second portion and the touch screen display, and such that the second portion is closer to the second plate than the first portion.

2. The electronic device of claim 1, further comprising:
    a hole extending from a portion of the side member,
    the hole configured to accommodate a stylus pen.

3. The electronic device of claim 1, wherein the conductive pattern includes:
    a first plurality of conductive lines extending parallel to one another; and
    a second plurality of conductive lines extending perpendicular to the first plurality of conductive lines,
    wherein the first plurality of conductive lines and the second plurality of conductive lines continuously extend through the first portion and the second portion of the layer.

4. The electronic device of claim 1, further comprising a flexible printed circuit board (FPCB),
    wherein the conductive pattern is formed on the FPCB.

5. The electronic device of claim 1, wherein the fingerprint sensor is disposed in a sunken area formed with the first portion and the second portion of the layer.

6. The electronic device of claim 1, further comprising a hardware module including at least one of the fingerprint sensor, a receiver, an iris sensor, and a proximity sensor.

7. The electronic device of claim 5, wherein the layer includes an electronic pen sensor.

8. The electronic device of claim 5, wherein the layer includes a shielding sheet.

9. The electronic device of claim 5, wherein at least one step is formed on an inner wall of the sunken area.

10. The electronic device of claim 5, further comprising a pressure sensor disposed adjacent to an outer wall of the sunken area.

11. The electronic device of claim 10, wherein a hole is formed through the pressure sensor.

12. The electronic device of claim 5, wherein at least one hole is formed through an inner wall of the sunken area.

13. The electronic device of claim 5, wherein a groove in fluid communication with the sunken area is formed in the layer.

14. The electronic device of claim 5, wherein a grooved structure or a corrugated structure is formed in an area of the layer.

15. The electronic device of claim 14, wherein the area of the layer corresponds to an area of the display panel where a symbol is displayed.

16. The electronic device of claim 5, further comprising a C-panel disposed on the layer,
- wherein at least one hole is formed through an area of the layer, and
- wherein a groove in fluid communication with the hole is formed in the C-panel.

17. The electronic device of claim 5, further comprising a conductive line formed on a wall of the sunken area that allows tensile strain caused by an external force.

18. The electronic device of claim 17, wherein the conductive line is twisted in zigzags on the wall.

19. The electronic device of claim 17, wherein the conductive line on the wall has a width greater than or equal to a specified thickness.

20. The electronic device of claim 17, wherein the conductive line includes a first conductive branch line formed on a top surface of the wall and a second conductive branch line formed on a bottom surface of the wall, and
- wherein the first conductive branch line and the second conductive branch line are electrically connected through a via-hole formed through the wall.

* * * * *